(12) United States Patent
Saito et al.

(10) Patent No.: US 6,765,821 B2
(45) Date of Patent: Jul. 20, 2004

(54) MAGNETIC MEMORY

(75) Inventors: Yoshiaki Saito, Kanagawa-ken (JP);
Tomomasa Ueda, Kanagawa-ken (JP);
Tatsuya Kishi, Kanagawa-ken (JP);
Minoru Amano, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/662,533

(22) Filed: Sep. 16, 2003

(65) Prior Publication Data

US 2004/0076035 A1 Apr. 22, 2004

(30) Foreign Application Priority Data

Sep. 30, 2002 (JP) ........................................ 2002-286463

(51) Int. Cl.$^7$ .............................................. G11C 11/14
(52) U.S. Cl. ...................... 365/158; 365/171; 365/175
(58) Field of Search ................................ 365/158, 171, 365/173, 175

(56) References Cited

U.S. PATENT DOCUMENTS

| 5,640,343 | A | 6/1997 | Gallagher et al. | |
|---|---|---|---|---|
| 5,659,499 | A | 8/1997 | Chen et al. | |
| 5,734,605 | A | 3/1998 | Zhu et al. | |
| 5,940,319 | A | 8/1999 | Durlam et al. | |
| 5,956,267 | A | 9/1999 | Hurst et al. | |
| 6,351,408 | B1 | 2/2002 | Schwarzl et al. | |
| 6,510,078 | B2 * | 1/2003 | Schwarzl | 365/158 |
| 6,611,405 | B1 * | 8/2003 | Inomata et al. | 360/324.2 |

FOREIGN PATENT DOCUMENTS

| JP | 10-4227 | 1/1998 |
|---|---|---|
| WO | WO 99/14760 | 3/1999 |
| WO | 197 44 095 | 4/1999 |
| WO | WO 00/10172 | 2/2000 |

OTHER PUBLICATIONS

J. S. Moodera, et al., "Ferromagnetic–Insulator–Ferromagnetic Tunneling: Spin–Dependent Tunneling and Large Magnetoresistance in Trilayer Junction (Invited)", vol. 79, No. 8, pp. 4724–4729, J. Appl. Phys., Apr. 15, 1996.

L. F. Schelp, et al., "Spin–Dependent Tunneling with Coulomb Blockade", vol. 56, No. 10, pp. R5747–R5750, Physical Review B, Sep. 1, 1997.

Y. Saito, et al., "Spin–Dependent Tunneling Through Layered Hard–Magnetic–Nano–Particles", vol. 23, No. 4–2, pp. 1269–1272, J. Jpn. Appl. Magn. Society, 1999 (with English Abstract).

F. Montaigne, et al., "Enhanced Tunnel Magnetoresistance at High Bias Voltage in Double–Barrier Planar Junctions", vol. 73, No. 19, pp. 2829–2831, Applied Physics Letters, Nov. 9, 1998.

Y. Saito, et al., "Correlation Between Barrier Width, Barrier Height, and DC Bias Voltage Dependences on the Magnetoresistance Ratio in Ir–Mn Exchange Biased Single and Double Tunnel Junctions", vol. 39, pp. L1035–L1038, Jpn. J. Appl. Phys., 2000.

\* cited by examiner

*Primary Examiner*—Vu A. Le
(74) *Attorney, Agent, or Firm*—Oblon, Spivak, McClelland, Maier & Neustadt, P.C.

(57) ABSTRACT

There are provided at least one wire, a magnetoresistive effect element having a storage layer whose magnetization direction varies according to a current magnetic field generated by causing a current to flow in the wire, and first yokes provided so as to be spaced from at least one pair of opposed side faces of the magnetoresistive effect element to form a magnetic circuit in cooperation with the magnetoresistive effect element when a current is caused to flow in the wire. Each of the first yokes has at least two soft magnetic layers which are stacked via a non-magnetic layer.

27 Claims, 17 Drawing Sheets

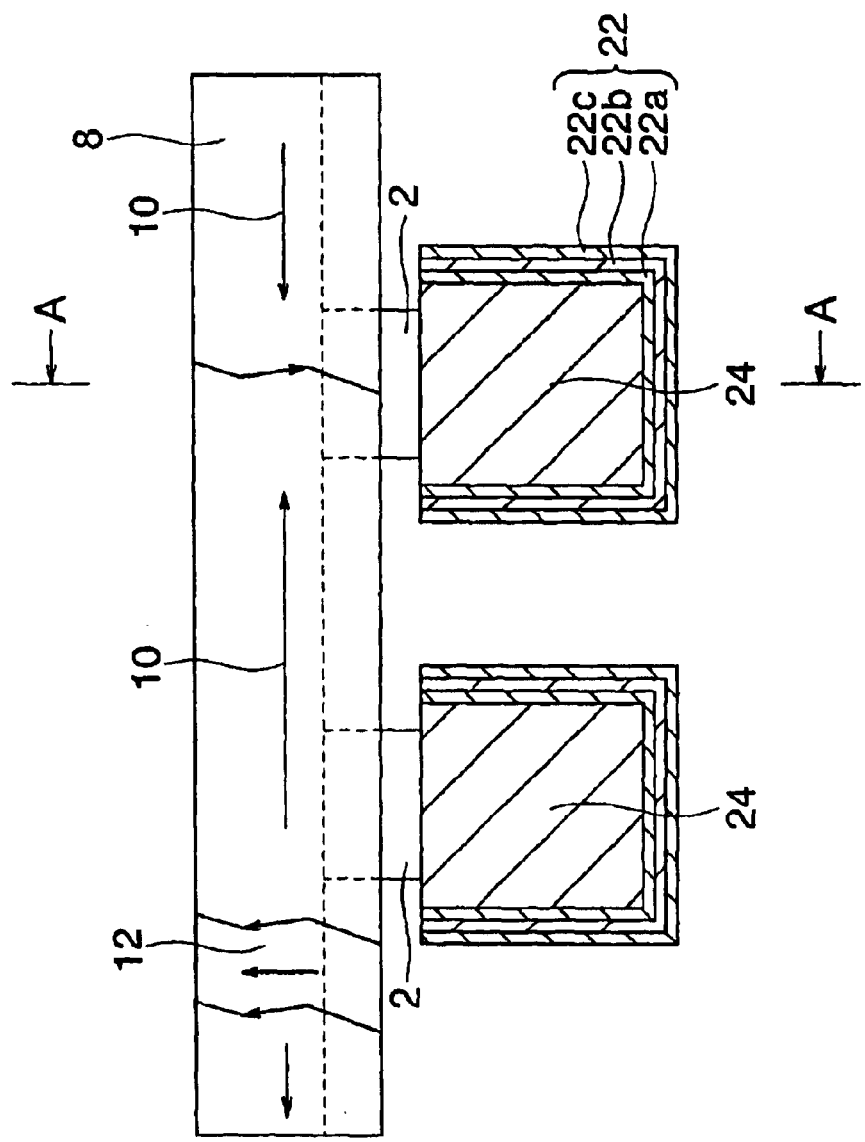

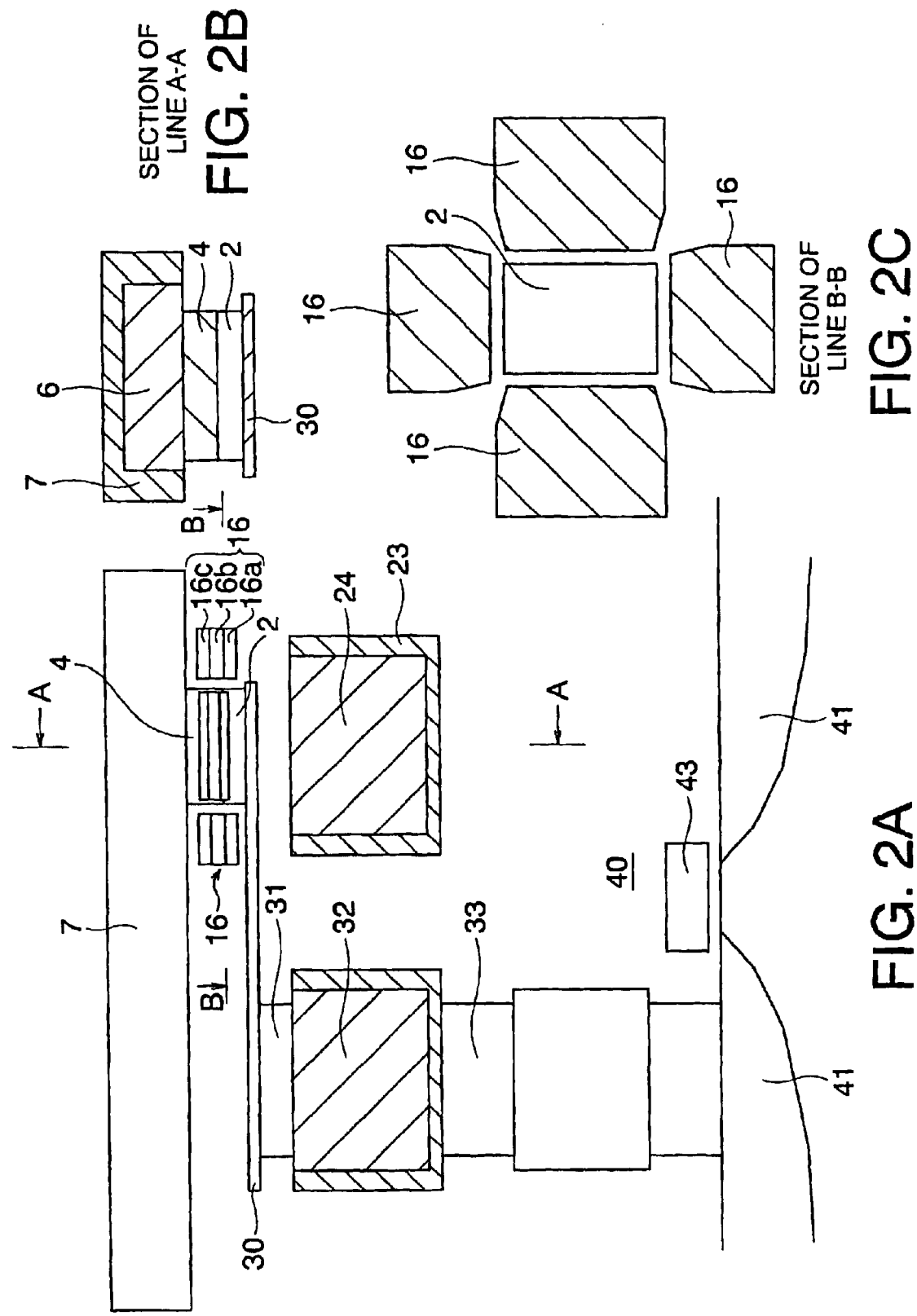

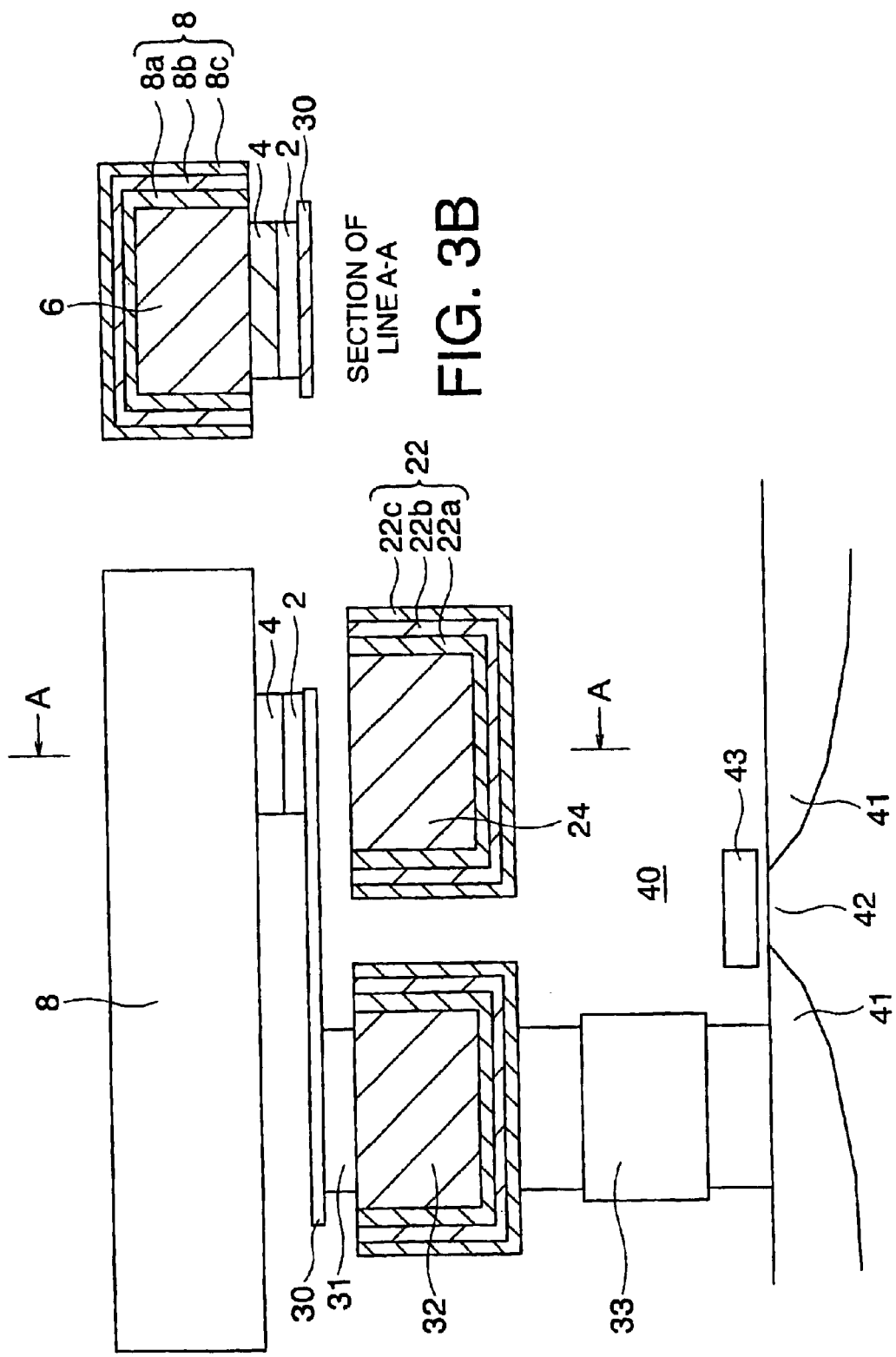

FLUCTUATIONS IN SWITCHING MAGNETIC FIELD dHc
AND OFFSET MAGNETIC FIELD dHoff

| | YOKE STRUCTURE | dHc(Oe) | dHoff(Oe) |
|---|---|---|---|
| EXAMPLE 1 | $Ni_{80}Fe_{20}/Ta/Ni_{80}Fe_{20}$ | 8.9 | 7.3 |
| MODIFIED EXAMPLE | $Co_{70.5}Fe_{4.5}Si_{15}B_{10}/TaN/Ni_{80}Fe_{20}$ | 8.1 | 6.6 |
| COMPARATIVE EXAMPLE 1 | $Ni_{80}Fe_{20}$ | 19.4 | 20.3 |
| COMPARATIVE EXAMPLE 2 | $Co_{70.5}Fe_{4.5}Si_{15}B_{10}$ | 16.4 | 18.3 |

FIG. 7

FLUCTUATIONS IN SWITCHING MAGNETIC FIELD dHc
AND OFFSET MAGNETIC FIELD dHoff

| | YOKE STRUCTURE | dHc(Oe) | dHoff(Oe) |
|---|---|---|---|
| EXAMPLE 2 | $Ni_{81}Fe_{19}/Ta/Ni_{81}Fe_{19}$ | 8.2 | 7.8 |
| MODIFIED EXAMPLE | $Ni_{81}Fe_{19}/TaN/Co_{87}Nb_5Zr_8$ | 7.8 | 8.1 |
| COMPARATIVE EXAMPLE 1 | $Ni_{81}Fe_{19}$ | 17.6 | 18.3 |
| COMPARATIVE EXAMPLE 2 | $Co_{87}Nb_5Zr_8$ | 17.7 | 19.1 |

FIG. 9

FLUCTUATIONS IN SWITCHING MAGNETIC FIELD dHc
AND OFFSET MAGNETIC FIELD dHoff

| | YOKE STRUCTURE | dHc(Oe) | dHoff(Oe) |
|---|---|---|---|
| EXAMPLE 3 | $Ni_{81}Fe_{19}/Ta/Ni_{81}Fe_{19}$ | 9.4 | 8.1 |
| MODIFIED EXAMPLE | $Ni_{81}Fe_{19}/TaN/Fe_{90}Cu_1Zr_7B_2$ | 7.7 | 9.1 |
| COMPARATIVE EXAMPLE 1 | $Ni_{81}Fe_{19}$ | 18.1 | 17.9 |
| COMPARATIVE EXAMPLE 2 | $Fe_{90}Cu_1Zr_7B_2$ | 13.2 | 15.9 |

FIG. 11

FLUCTUATIONS IN SWITCHING MAGNETIC FIELD dHc
AND OFFSET MAGNETIC FIELD dHoff

| | YOKE STRUCTURE | dHc(Oe) | dHoff(Oe) |
|---|---|---|---|
| EXAMPLE 4 | $Ni_{81}Fe_{19}/Ta/Ni_{81}Fe_{19}$ | 8.2 | 7.8 |
| MODIFIED EXAMPLE | $Ni_{81}Fe_{19}/TaN/Co_{87}Nb_5Zr_8$ | 8.5 | 7.4 |
| COMPARATIVE EXAMPLE 1 | $Ni_{81}Fe_{19}$ | 17.8 | 16.3 |
| COMPARATIVE EXAMPLE 2 | $Co_{87}Nb_5Zr_8$ | 15.4 | 18.3 |

FIG. 14

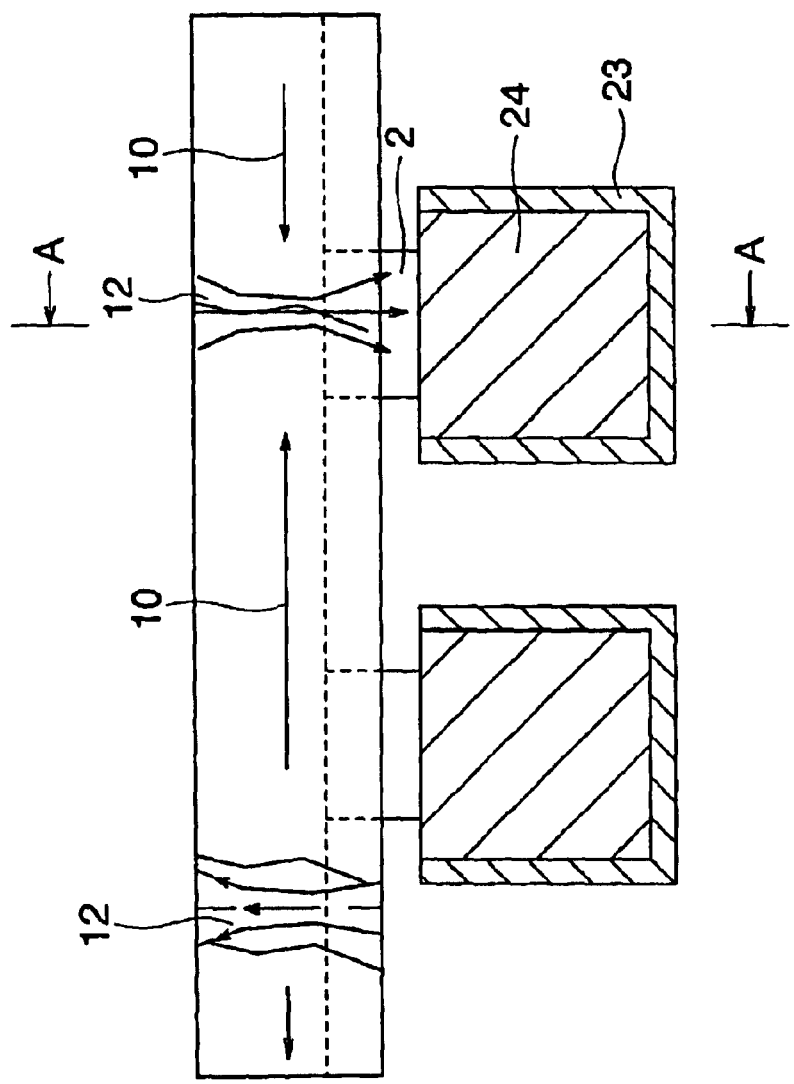

MAGNETIC MEMORY

CROSS-REFERENCE TO RELATED APPLICATIONS

This application is based upon and claims the benefit of priority from prior Japanese Patent Application No. 2002-286463, filed on Sep. 30, 2002 in Japan, the entire contents of which are incorporated herein by reference.

BACKGROUND OF THE INVENTION

1. Field of the Invention

The present invention relates to a magnetic memory.

2. Related Art

A magnetoresistive effect element having magnetic substance films is used for a magnetic head, a magnetic sensor an so forth, and it has been proposed to be used for a solid magnetic memory. In particular, there is an increasing interest in a. magnetic random access memory (hereinafter, referred to as "MRAM (Magnetic Random Access Memory)), which utilizes the magnetoresistive effect of ferromagnetic substance, as a next generation solid nonvolatile memory capable of carrying out a rapid reading/writing and an operation with large capacity and low power consumption.

In recent years, a ferromagnetic tunnel junction element or the so-called "tunneling magnetoresistive element (TMR element)" has been proposed as a magnetoresistive effect element utilizing a tunnel current and having a sandwiching structure where one dielectric is inserted between two ferromagnetic metal layers, and a current is caused to flow perpendicular to a film face to utilize a tunneling current. In the tunneling magnetoresistive element, since a magnetoresistive change rate with 20% or more has been achieved (refer to J. Appl. Phys. 79, 4724 (1996)), a possibility of the MRAM to public application is increasing.

The tunneling magnetoresistive element can be realized by deposing a thin Al (aluminum) layer with a thickness of 0.6 nm to 2.0 nm on a ferromagnetic layer, and thereafter, exposing the surface of the Al layer to oxygen glow discharge or oxygen gas to form a tunnel barrier layer comprising $Al_2O_3$.

Further, a ferromagnetic single tunnel junction having a structure where an anti-ferromagnetic layer is applied to one of ferromagnetic layers constituting the ferromagnetic single tunnel junction element to form a magnetization fixed layer has been proposed (refer to Japanese Patent Laid-Open No. 10-4227)

Furthermore, a tunneling magnetoresistive element where magnetic particles have been dispersed in a dielectric and a ferromagnetic dual tunnel junction element have been proposed (refer to Phy. Rev. B56(10), R5747 (1997); Appl. Magnetism Lett 23, 4-2, (1999); Appl. Phys. Lett. 73(19), 2829(1998); and Jpn. J. Appl. Phys. 39, L1035 (2001)).

In view of the fact that a magnetoresistive change rate in a range of 20% to 50% have been also achieved in these tunneling magnetoresistive elements and the fact that reduction in magnetoresistive change rate can be suppressed even if a voltage value to be applied to a tunneling magnetoresistive element is increased in order to obtain a desired output voltage value, there is a possibility of the TMR element to application to the MRAM.

When the TMR element is used in the MRAM, one of two ferromagnetic layers sandwiching a tunnel barrier layer, i.e., a magnetization fixed layer whose magnetization direction is fixed so as not to change is defined as a magnetization reference layer, and the other thereof, i.e., a magnetization free layer whose magnetization direction is constituted to be easily reversed is defined as a storage layer. Information or data can be stored by causing a parallel state where the magnetization directions of the reference layer and the storage layer are parallel and an anti-parallel state where they are not parallel to correspond to "0" and "1" of binary information.

A writing operation of record information is performed by inverting the magnetization direction in the storage layer by an induction magnetic field generated by causing current to flow in a writing wire provided in the vicinity of the TMR element. Further, a reading operation of record information is conducted by detecting a resistance change amount due to a TMR effect.

For the purpose of fixing the magnetization direction in the reference layer, such a method that an anti-ferromagnetic layer is provided so as to come in contact with a ferromagnetic layer so that occurrence of inverting magnetization is made hard by the exchange coupling force is employed, and such a structure is called a spin valve type structure. In this structure, the magnetization direction of the reference layer is determined by conducting a heat treatment (magnetization fixing annealing) while a magnetic field is being applied. On the other hand, the storage layer is formed such that a magnetization easy direction and the magnetization direction of. the reference layer are made approximately equal to each other by applying a magnetic anisotropy.

A magnetic recording element using the ferromagnetic single tunnel junction or the ferromagnetic dual tunnel junction has such a characteristic that writing/reading time can be conducted at a high speed such as 10 nanoseconds or less, even if it is non-volatile, and it has a potential such that the number of rewritings is $10^{15}$ or more. In particular, as described above, in the magnetic recording element using the ferromagnetic dual tunnel junction element, even if a voltage value to be applied to the tunneling magnetoresistive element is increased in order to obtain a desired output voltage value, reduction in magnetoresistive change rate can be suppressed so that a large output voltage can be obtained. Thus, a preferable characteristic can be developed as the magnetic recording element.

However, regarding a cell size of the memory, when an architecture where a cell is constituted by one transistor and one TMR element (refer to U.S. Pat. No. 5,734,605) is used, there occurs such a problem that the cell can not be reduced down to the size of a DRAM (Dynamic Random Access Memory) of a semiconductor device or smaller.

In order to solve this problem, a diode type architecture where a TMR element and a diode are connected in series between a bit line and a word line (refer to U.S. Pat. No. 5,640,343) and a simple matrix type architecture where a cell having a TMR element is disposed between a bit line and a word line (refer to German Patent Application Laid-Open No. 19744095, and International Publication WO99/14760 pamphlet) have been proposed.

However, in the both cases, since reversal is conducted with a current magnetic field due to current pulses at a writing time into a storage layer, power consumption is large. Further, since an allowable current density in a wire when a mass storage is to be achieved is limited, the mass storage can not be achieved. Furthermore, unless an absolute value of a current flow is 1 mA or less, an area of a driver for allowing a current to flow becomes large. There occurs such a problem that the memory becomes large in chip size, as compared with another non-volatile solid magnetic memory, for example, a ferroelectric random access memory using a ferroelectric substance capacitor, a flush memory or the like, so that a competitive power of the memory is lost.

In order to solve the above problem, magnetic storage devices where a thin film comprising magnetic material with a high magnetic permeability is provided about a writing wire have been proposed (refer to U.S. Pat. No. 5,659,499; U.S. Pat. No. 5,956,267; International Publication WO00/10172 Pamphlet; and U.S. Pat. No. 5,940,319). According to these magnetic storage devices, since a magnetic film with a high magnetic permeability is provided about a wire, a current value required for information writing in a magnetic recording layer can be reduced efficiently.

In the magnetic storage device disclosed in U.S. Pat. No. 5,659,499, however, a magnetic field applied to a recording layer of magnetoresistive effect films is uneven, and in the magnetic storage devices disclosed in U.S. Pat. No. 5,956,267 and U.S. Pat. No. 5,940,319, it is difficult to apply a magnetic field to a magnetization free layer efficiently in such a structure that the magnetization free layer (a free layer) is embedded in a central portion of stacked magnetic layers like the dual spin valve type double tunnel junction. On the other hand, in the magnetic storage device disclosed in International Publication WO00/10172, such a structure that a large magnetic field can be applied to a magnetization free layer is employed, but it becomes considerably difficult to manufacture the magnetic storage device.

Further, regarding yoke wire structures disclosed in the above U.S. Pat. Nos. 5,659,499, 5,956,267, 5,940,319 and WO00/10172, such a case is now considered that a distance between a TMR element and a yoke wire end portion is reduced in order to increase an efficiency of a current magnetic field or make a design rule small. In this case, as shown in FIGS. 19A and 19B, even if magnetization 10 showing a magnetic anisotropy in a longitudinal direction of a wire 6 is given, an effective magnetic field toward a TMR element 2 is generated by an influence of a leakage magnetic field 12 occurring from a domain end portion due to a domain structure occurring in a magnetic film 7 covering a wire 6, so that a value of a switching magnetic field of the TMR element 2 and a value of an offset magnetic field of the TMR element 2 (the offset magnetic field is ordinarily set to about 0 when there is not any influence of a magnetic field from an end portion of the yoke magnetic field 7) are fluctuated. For this reason, it has been understood that a problem about a cross talk or the like occurs and there is such a problem that a solid magnetic memory does not operate normally. Incidentally, FIG. 19A is a front view showing a constitution of a conventional simple matrix type magnetic memory, and FIG. 19B is a sectional view of the memory taken along line A—A shown in FIG. 19A. In FIG. 19B, wires 24 are omitted. In FIGS. 19A and 19B, the wire 6 is electrically connected to the TMR element 2 via a plug 4, and a wire 24 provided so as to cross the wire 6 is electrically connected directly to the TMR element 2. Further, the wire 24 is also covered with a magnetic film 23 like the wire 6.

SUMMARY OF THE INVENTION

The present invention has been made in view of the above circumstances, and an object thereof is to provide a magnetic memory where power consumption can be reduced and the fluctuations of values of a switching magnetic field and the offset magnetic field of the TMR element can be suppressed.

A magnetic memory according to a first aspect of the present invention includes: at least one wire; a magnetoresistive effect element having a storage layer whose magnetization direction varies according to a current magnetic field generated by causing a current to flow in the wire; and first yokes which are provided so as to be spaced from at least one pair of opposed side faces of the magnetoresistive effect element to form a magnetic circuit in cooperation with the magnetoresistive effect element when a current is caused to flow in the wire, each of the first yokes having at least two soft magnetic layers which are stacked via a non-magnetic layer.

A magnetic memory according to a second aspect of the present invention includes: at least one wire; a magnetoresistive effect element having a storage layer whose magnetization direction varies according to a current magnetic field generated by causing a current to flow in the wire; and a yoke which is provided at least on both side faces of the wire to form a magnetic circuit in cooperation with the magnetoresistive effect element when a current is caused to flow in the wire, the yoke having at least two soft magnetic layers stacked via a non-magnetic layer.

A magnetic memory according to a third aspect of the present invention includes: at least one wire; a magnetoresistive effect element having a storage layer whose magnetization direction varies according to a current magnetic field generated by causing a current to flow in the wire; and a yoke which is provided on both side faces of the wire and on an opposite face of the wire to the magnetoresistive effect element to form a magnetic circuit in cooperation with the magnetoresistive effect element when a current is caused to flow in the wire, the yoke having at least two soft magnetic layers stacked via a non-magnetic layer.

BRIEF DESCRIPTION OF THE DRAWINGS

FIGS. 1A to 1B are views showing a constitution of a magnetic memory according to a first embodiment of the present invention;

FIGS. 2A to 2C are views showing a constitution of a magnetic memory according to a second embodiment of the present invention;

FIGS. 3A to 3B are views showing a constitution of a magnetic memory according to a third embodiment of the present invention;

FIG. 7 is a table for explaining an effect of the magnetic memory cell according to Example 1;

FIG. 9 is a table for explaining an effect of the magnetic memory cell according to Example 2;

FIG. 11 is a table for explaining an effect of the magnetic memory cell according to Example 3;

FIG. 14 is a table for explaining an effect of the magnetic memory cell according to Example 4;

FIGS. 19A to 19B are views showing a constitution of a conventional magnetic memory.

EMBODIMENTS OF THE INVENTION

Figure 4B:
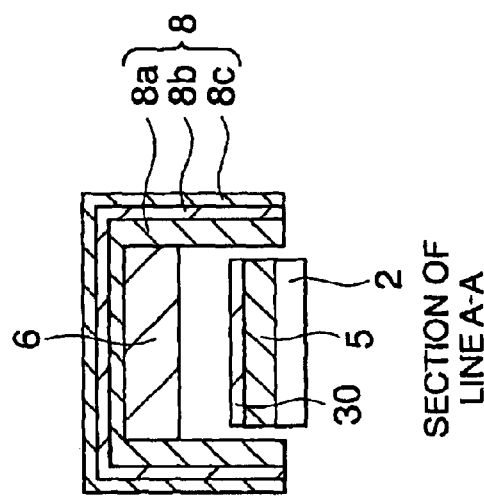
FIGS. 4A to 4B are views showing a constitution of a magnetic memory according to a fourth embodiment of the present invention.

Hereinafter, the embodiments of the present invention will be described with reference to accompanying drawings.

(First Embodiment)

A constitution of a magnetic memory according to a first embodiment of the present invention will be shown in FIGS. 1A and 1B. FIG. 1A is a view showing a constitution of the magnetic memory according to this embodiment, and FIG. 1B is a sectional view of the magnetic memory taken along line A—A shown in FIG. 1A. The magnetic memory of this embodiment is of a simple matrix type, where each magnetoresistive effect element 2 is provided, as a storage memory, for each crossing point between a wire 6 and a wire 24 crossing the wire 6. The magnetoresistive effect element 2 is electrically connected directly to the wire 6 via a connection plug 4, and it is directly connected to the wire 24. Further, the wire 6 is covered with a yoke 8 provided with soft magnetic layers 8a, 8c stacked via a non-magnetic layer 8b, and the wire 24 is covered with a yoke 22 provided with soft magnetic layers 22a, 22c stacked via a non-magnetic layer 22b. Incidentally, an insulating film (not shown) is interposed between the magnetoresistive effect element 2 and each of the yokes 8, 22. Similarly, the above insulating film is interposed between the connection plug 4 and the yoke 8.

In the embodiment constituted in this manner, reading-out of information is performed by causing a current to flow in the magnetoresistive effect element 2 to make judgement about "1" or "0" on the basis of the magnitude of the resistance value of the magnetoresistive effect element 2. Writing of information in the magnetoresistive effect element 2 is performed by a magnetic field obtained by composing current magnetic fields occurring due to currents flowing in the wire 6 and the wire 24. The magnetization of a storage layer in the magnetoresistive effect element 2 can be reversed by the composed magnetic field.

In this embodiment, since the yoke 8, 22 covering the wire 6, 24 has a double layer yoke structure where soft magnetic layers are doubly stacked via a non-magnetic layer, a magnetic coupling called "a nail-nail coupling" occurs between the soft magnetic layers. When the film thickness of the non-magnetic layer is thin, a magnetic coupling called "an interlayer coupling" further occurs. In case that a distance between the magnetoresistive effect element 2 and an end portion of the yoke 8, 22 has been shortened in order to increase efficiency of a current magnetic field or make a design rule small, even if magnetization 10 developing magnetic anisotropy in a longitudinal direction of the wire is given to the yoke 8, 22, a leakage magnetic field 12 occurring from a domain end portion does not leak outside, as shown in FIG. 1B, and it does not influence an action of the magnetoresistive effect element 2. For this reason, fluctuations of a switching magnetic field and an offset magnetic field of the magnetoresistive effect element 2 can be reduced. Thereby, occurrence of a cross talk can be suppressed. Further, since the yoke 8, 22 covers the wire 6, 24, power consumption can be reduced.

Incidentally, in this embodiment, both the wire 6 and the wire 24 have been respectively covered with yokes where soft magnetic layers are doubly stacked via a non-magnetic layer, but even though such a constitution that only one of the wire 6 and the wire 24 is covered with a yoke in which soft magnetic layers are doubly stacked via a non-magnetic layer, while the other wire is covered with a yoke having a single soft magnetic layer in a conventional manner is employed, a similar effect or advantage to the above can be achieved.

In this embodiment, also, the yoke 8, 22 has such a constitution that soft magnetic layers are doubly stacked via a non-magnetic layer, but even though a multi-layer yoke structure where soft magnetic layers are stacked via non-magnetic layers in a multi-layer manner exceeding two layers is employed, a similar effect can be achieved.

(Second Embodiment)

Next, a magnetic memory of a second embodiment of the present invention will be explained with reference to FIGS. 2A, 2B and 2C. FIG. 2A is a sectional view showing a unit cell of a magnetic memory according to this embodiment where a magnetoresistive effect element 2 is used as the storage element and a MOS transistor 40 is used as a cell selecting element. FIG. 2B is a sectional view of the unit cell taken along ling A—A shown in FIG. 2A, and FIG. 2C is a sectional view of the unit cell taken along line B—B shown in FIG. 2A. Incidentally, a wire 24 and a yoke 16 described later will be omitted in FIG. 2B.

In this embodiment, one end of a magnetoresistive effect element 2 is connected to a wire (a bit line) 6 via a connection plug 4, while the other end thereof is connected to one of a source/a drain 41 of a selecting transistor 40 via an lead electrode 30, and connection plugs 31, 32 and 33, and a wire (word line) 24 is provided below the magnetoresistive effect element 2. Incidentally, an insulating layer (not shown) is interposed between the wire 24 and the lead electrode 30.

Then, such a constitution that the wire 6 and the wire 24 are respectively covered with a yoke 7 and a yoke 23 where a soft magnetic layer has a single layer structure is employed. Incidentally, since the connection plug 32 is formed simultaneously with formation of the wire 24, the connection plug 32 is also covered with a soft magnetic layer.

In this embodiment, however, as shown in FIGS. 2A and 2C, four yokes 16 having a structure where a soft magnetic layer 16a, a non-magnetic layer 16b and a soft magnetic layer 16c are stacked are provided on approximately the same plane as the magnetoresistive effect element 2 so that the yoke 16 of the structure where the soft magnetic layer 16c surrounds the magnetoresistive effect element 2. Incidentally, the yokes 16 may be two yokes provided so as to be spaced from a pair of opposite side faces of the magnetoresistive effect element.

In the embodiment constituted in this manner, reading-out of information is performed by applying a potential to a gate 43 of the selecting transistor 40 to turn on the selecting transistor 40, and causing a current to flow in the magnetoresistive effect element 2 selected by the selecting transistor 40 to make judgement about "1" or "0" on the basis of the magnitude of the resistance of the magnetoresistive effect element 2. Writing of information in the magnetoresistive effect element 2 is performed by a magnetic field obtained by composing current magnetic fields occurring due to currents flowing in the wire 6 and the wire 24. The magnetization direction of a storage layer in the magnetoresistive effect element 2 can be inverted by the composed magnetic field.

In this embodiment, since the yokes 16 having the double layer yoke structure where the soft magnetic layer 16a, the non-magnetic layer 16b and the soft magnetic layer 16c have been stacked are provided on approximately the same plane as the magnetoresistive effect element 2 so as to surround the magnetoresistive effect element 2, even if magnetization developing a magnetic anisotropy in a longitudinal direction of the wire is applied to the yokes 7 and 23, a leakage magnetic field occurring from a domain end portion is absorbed by the yoke 16 and it does not influence the magnetoresistive effect element 2. Fluctuations of a switching magnetic field and an offset magnetic field of the magnetoresistive effect element 2 can be reduced. Thereby, occurrence of a cross talk can be suppressed. Further, since the yoke 7, 23 is covered with the wire 6, 24, a consumption power can be reduced.

Incidentally in this embodiment, it is preferable that a distance between an end portion of the magnetoresistive effect element 2 and an end portion of the yoke 16 is larger than 0.1 $\mu$m. It is preferable that the film thickness of the non-magnetic layer 16b constituting the yoke 16 is smaller than the distance between the end portion of the magenetoresistance effect element 2 and the end portion of the yoke 16. Further, in this embodiment, the yoke 16 has the double layer yoke structure where the soft magnetic layers are doubly stacked via the non-magnetic layer, but it may have a multi-layer yoke structure where soft magnetic layers are stacked via non-magnetic layers in multiple layers exceeding two layers.

(Third Embodiment)

Next, a magnetic memory according to a third embodiment of the present invention will be explained with reference to FIGS. 3A and 3B. FIG. 3A is a sectional view showing a unit cell of a magnetic memory according to this embodiment where a magnetoresistive effect element 2 is used as the storage element and a MOS transistor 40 is used as a cell selecting element. FIG. 3B is a sectional view of the unit cell taken along ling A—A shown in FIG. 3A. Incidentally, a wire 24 and a yoke 16 described later will be omitted in FIG. 3B.

In this embodiment, one end of a magnetoresistive effect element 2 is connected to a wire (a bit line) 6 via a connection plug 4, while the other end thereof is connected to one of a source/a drain 41 of a selecting transistor 40 via a lead electrode 30, and connection plugs 31, 32 and 33, and a wire (word line) 24 is provided below the magnetoresistive effect element 2. Incidentally, an insulating layer (not shown) is interposed between the wire 24 and the lead electrode 30.

Like the case of the first embodiment, the wire 6 is covered with a yoke 8 provided with soft magnetic layers 8a and 8c stacked via a non-magnetic layer 8b, and the wire 24 is covered with a yoke 26 provided with soft magnetic layers 22a and 22b stacked via a non-magnetic layer 22b.

Incidentally, since a connection plug 32 is formed simultaneously with formation of the wire 24, and the connection plug 32 is also covered with a yoke 22 provided with soft magnetic layers 22a and 22c stacked via a non-magnetic layer 22b. However, it is possible to remove the yoke 22 covering the connection plug 32 to constitute a connection plug structure.

In the embodiment constituted in this manner, reading-out of information is performed by applying a potential to a gate 43 of the selecting transistor 40 to turn on the selecting transistor 40, and causing a current to flow in the magnetoresistive effect element 2 selected by the selecting transistor 40 to make judgement about "1" or "0" on the basis of the magnitude of the resistance of the magnetoresistive effect element 2. Writing of information in the magnetoresistive effect element 2 is performed by a magnetic field obtained by composing current magnetic fields occurring due to currents flowing in the wire 6 and the wire 24. The magnetization of a storage layer in the magnetoresistive effect element 2 can be reversed by the composed magnetic field.

In this embodiment, since the yoke 8, 22 covering the wire 6, 24 has a double layer yoke structure where soft magnetic layers are doubly stacked via a non-magnetic layer, a magnetic coupling occurs between the soft magnetic layers. Thereby, when the distance between the magnetoresistive effect element 2 and an end portion of the yoke 8, 22 has been shortened in order to increase efficiency of a current magnetic field or make a design rule small, even if magnetization developing magnetic anisotropy in a longitudinal direction of the wire is given to the yoke 8, 22, a leakage magnetic field occurring from a domain end portion does not leak outside, and it does not influence an action of the magnetoresistive effect element 2. For this reason, fluctuations of a switching magnetic field and an offset magnetic field of the magnetoresistive effect element 2 can be reduced. Thereby, occurrence of a cross talk can be suppressed. Further, since the yoke 8, 22 covers the wire 6, 24, power consumption can be reduced.

Incidentally, in this embodiment, both the wire 6 and the wire 24 have been respectively covered with yokes where soft magnetic layers are doubly stacked via a non-magnetic layer, but even though such a constitution that only one of the wire 6 and the wire 24 is covered with a yoke in which soft magnetic layers are doubly stacked via a non-magnetic layer, while the other wire is covered with a yoke having a single soft magnetic layer in a conventional manner is employed, a similar effect or advantage to the above can be achieved. For example, when only the wire 6 has been covered with the above-described yoke, since the connection plug 32 is not formed with a yoke, it becomes possible to reduce a wire resistance.

Further, in this embodiment, the yoke 8, 22 has the double layer yoke structure where the soft magnetic layers are doubly stacked via the non-magnetic layer, but even though a multi-layer yoke structure where soft magnetic layers are stacked via non-magnetic layers in a multi-layer manner exceeding two layers is employed, a similar effect can be achieved.

(Fourth Embodiment)

Figure 4A:
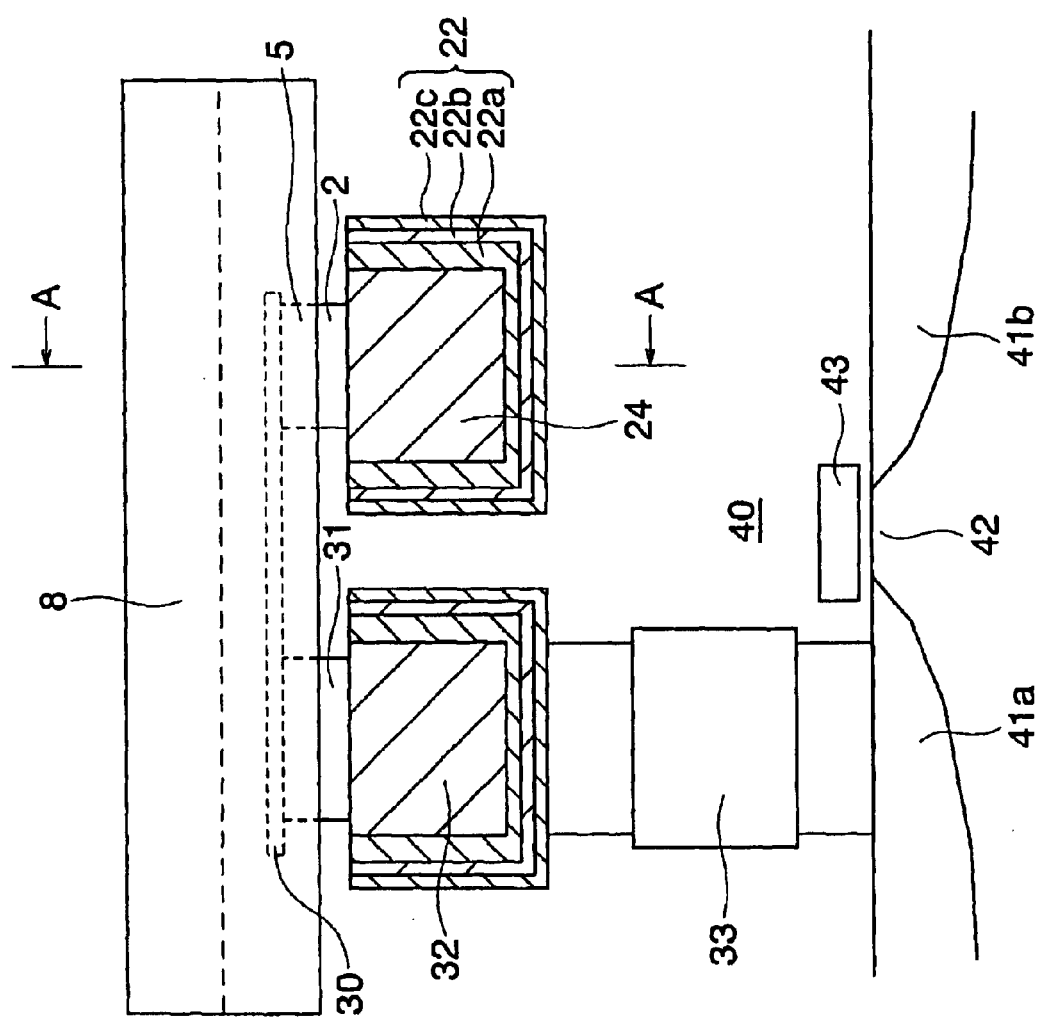

Next, a magnetic memory according to a fourth embodiment of the present invention will be described with reference to FIGS. 4A and 4B. FIG. 4A is a sectional view showing a unit cell of a magnetic memory according to this embodiment where a magnetoresistive effect element 2 is used as the storage element and a MOS transistor 40 is used as a cell selecting element. FIG. 4B is a sectional view of the unit cell taken along ling A—A shown in FIG. 4A. Incidentally, a wire 24 and a yoke 16 described later will be omitted in FIG. 4B.

In this embodiment, one end of a magnetoresistive effect element 2 is connected to one of a source/a drain 41 of a selecting transistor 40 via a connection plug 5, a lead electrode 30, and connection plugs 31, 32 and 33, while the other end thereof is connected to a wire (a bit line) 24. A wire (word line) 6 is provided above the lead wire 30. Incidentally, an electrically insulating layer (not shown) is interposed between the wire 6 and the lead electrode 30.

Like the case of the first embodiment, the wire 6 is covered with a yoke 8 provided with soft magnetic layers 8a and 8c stacked via a non-magnetic layer 8b, and the wire 24 is covered with a yoke 26 provided with soft magnetic layers 22a and 22b stacked via a non-magnetic layer 22b. Incidentally, since the connection plug 32 is formed simultaneously with formation of the wire 24, the connection plug 32 is also covered with a yoke 22 provided with soft magnetic layers 22a and 22c stacked via a non-magnetic layer 22b. However, it is possible to remove the yoke 22 covering the connection plug 32 to constitute a connection plug structure. Incidentally, an end portion of the yoke 8 covering the wire 6 extends up to a position near the magnetoresistive effect element 2.

In the embodiment constituted in this manner, reading of information is performed by applying a potential to a gate 43 of the selecting transistor 40 to turn on the selecting transistor 40, and causing a current to flow in the magnetoresistive effect element 2 selected by the selecting transistor 40 to make judgement about "1" or "0" on the basis of the magnitude of the resistance of the magnetoresistive effect element 2. Writing of information in the magnetoresistive effect element 2 is performed by a magnetic field obtained by composing current magnetic fields occurring due to currents flowing in the wire 6 and the wire 24. The magnetization of a storage layer in the magnetoresistive effect element 2 can be reversed by the composed magnetic field.

In this embodiment, since the yoke 8, 22 covering the wire 6, 24 has a double layer yoke structure where soft magnetic layers are doubly stacked via a non-magnetic layer, a magnetic coupling occurs between the soft magnetic layers. Thereby, when the distance between the magnetoresistive effect element 2 and an end portion of the yoke 6, 22 has been shortened in order to increase efficiency of a current magnetic field or make a design rule small, even if magnetization developing magnetic anisotropy in a longitudinal direction of the wire is given to the yoke 8, 22, a leakage magnetic field 12 occurring from a domain end portion does not leak outside, and it does not influence an action of the magnetoresistive effect element 2. For this reason, fluctuations of a switching magnetic field and an offset magnetic field of the magnetoresistive effect element 2 can be reduced. Thereby, occurrence of a cross talk can be suppressed. Further, since the yoke 8, 22 covers the wire 6, 24, power consumption can be reduced.

Incidentally, in this embodiment, both the wire 6 and the wire 24 have been respectively covered with yokes where soft magnetic layers are doubly stacked via a non-magnetic layer, but even though such a constitution that only one of the wire 6 and the wire 24 is covered with a yoke in which soft magnetic layers are doubly stacked via a non-magnetic layer, while the other wire is covered with a yoke having a single soft magnetic layer in a conventional manner is employed, a similar effect or advantage to the above can be achieved. For example, when only the wire 6 has been covered with the above-described yoke, since the connection plug 32 is not formed with a yoke, it becomes possible to reduce a wire resistance.

Further, in this embodiment, the yoke 6, 22 has the double layer yoke structure where the soft magnetic layers are doubly stacked via the non-magnetic layer, but even though a multi-layer yoke structure where soft magnetic layers are stacked via non-magnetic layers in a multi-layer manner exceeding two layers is employed, a similar effect can be achieved.

In the above-described first to fourth embodiments explained above, it is preferable that a barrier metal is provided adjacent to the multi-layer yoke. The barrier metal is preferably at least one element selected from the group consisting of Ta, Ti, Si, Ge, Al, W, Mo, and V or an alloy thereof, or oxide or nitride thereof.

Further, in the first to fourth embodiments, the soft magnetic layer constituting the multi-layer yoke is preferably Ni—Fe alloy, Co—Fe—Ni alloy, or an amorphous magnetic layer or a micro-crystal ferromagnetic layer described later. The above-described amorphous magnetic layer or micro-crystal ferromagnetic layer is expressed by the following atomic symbol. That is, Co—Fe—AA, Co—Fe—AA—AA2, Fe—AA—AA2, Co—AA—AA2, Co—Mn—AA—AA2, Fe—Cu—AA—AA2, or Co—Fe—Ni—AA, where AA, AA2 is preferably at least one element selected from a group consisting of B, Si, Ge, Zr, Nb, P, Mo, Ta, N, C, Ti, Al, W, V and a rare earth element.

Furthermore, in the first to fourth embodiments, the non-magnetic layer constituting the multi-layer yoke is preferably at least one element selected from the group consisting of Al, Ga, In, Si, Ge, Ti, Zr, Hf, V, Nb, Ta, Cr, Mo, W, Cu, Zn, Ag, Au, Ru, Re, and 02, or alloy thereof or oxide or nitride thereof.

In the first to fourth embodiments, also, when an interaction between the soft magnetic layers constituting the multi-layer yoke is in a range of −2000 Oe to 500 Oe, there occurs a merit that fluctuations of the switching magnetic field and the offset magnetic field can be suppressed to be low even if the magnetoresistive effect element and the multi-layer yoke are caused to approach to each other, and a high frequency magnetic loss can be reduced even if the design rule is made small. Incidentally, the minus of the interaction indicates a state that the magnetization directions are opposed to each other and the plus thereof indicates a state that the magnetization directions are in the same direction.

Further, the magnetoresistive effect element which can be used in the magnetic memory of the present invention includes a tunnel junction element (a TMR element) having such as a tunneling magnetoresistive effect or a ferromagnetic tunnel junction as a ferromagnetic single tunnel junction, a ferromagnetic double tunnel junction or the like. As the magnetoresistive effect element, an element of "a spin valve structure" where a first ferromagnetic layer, a non-magnetic layer and a second ferromagnetic layer are stacked can be used besides the TMR element where the first ferromagnetic layer, the insulating layer and the second ferromagnetic layer have been stacked.

In either case, such a constitution can be employed that the first ferromagnetic layer is caused to act as "a magnetization fixed layer" where the magnetization direction has been substantially fixed (it may be called as "a pin layer") and the second ferromagnetic layer is caused to act as "a magnetization recording layer" whose magnetization direction can be changed by external application of a magnetic field.

Further, as described later, according to a reading-out system, the first ferromagnetic layer may be caused to act as "a magnetization free layer" where the magnetization direction can be changed.

In these magnetoresistive effect elements, as the ferromagnetic substance which can be use as the magnetization fixed layer, for example, Fe (iron), Co (cobalt), Ni (nickel) or alloy thereof, or oxide such as magnetite with a large spin polarizability, $CrO_2$, $RXMnO_{3-y}$ (where R represents a rare earth metal, and X represents either one of Ca (calcium), Ba (barium) and Sr (strontium)), or Heusler's alloy such as NiMnSb (nickel•manganese•antimony), PtMnSb (platinum manganesea•antimony) or the like can be used.

It is preferable that the magnetization fixed layer comprising these materials has one directional anisotropy. It is also preferable that the thickness of the magnetization fixed layer is in a range of 0.1 nm to 100 nm. Further, it is more preferable that the film thickness of the magnetization fixed layer is 0.4 nm or more, because it must be such a thickness that the layer does not become superparamagnetism.

It is also preferable to add an anti-ferromagnetic layer to the ferromagnetic layer used as the magnetization fixed layer to fix the magnetization. Such an anti-ferromagnetic layer can include Fe (iron)-Mn (manganese), Pt (platinum)-Mn (manganese), Pt (platinum)-Cr (chrome)-Mn (manganese), Ni (nickel)-Mn (manganese), Ir (iridium)-Mn (manganese), NiO (nickel oxide), $Fe_2O_3$ (iron oxide) or the like.

Further, these magnetic substances may be added with a non-magnetic element such as Ag (silver), Cu (copper), Au (gold), Al (aluminum), Mg (magnesium) Si (silicon), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), Nb (niobium), B (boron) or the like so that its magnetic characteristic can be adjusted. Besides, various physical properties of the magnetic substances such as crystal properties, mechanical properties or chemical properties may be adjusted.

As the magnetization fixed layer, a stacked layer of a ferromagnetic layer(s) and a non-magnetic layer(s) may be used. For example, a three-layers structure of a ferromagnetic layer/a non-magnetic layer/a ferromagnetic layer can be used. In this case, it is preferable that an interaction between the anti-ferromagnetic layers is acting on both the ferromagnetic layers via the non-magnetic layer.

More specifically, as a method for fixing the magnetic layer in one direction, it is preferable that a stacked film with a three-layers structure such as Co (Co—Fe)/Ru (ruthenium)/Co (Co—Fe), Co (Co—Fe)/Ir (iridium)/Co (Co—Fe), Co (Co—Fe)/Os (osmium)/Co (Co—Fe), Co (Co—Fe)/Re (rhenium)/Co (Co—Fe) or the like is made as a magnetization fixed layer, and an antiferromagnetic layer is further provided adjacent to the stacked layer. In this case, as the anti-ferromagnetic layer, Fe—Mn, Pt—Mn, Pt—Cr—Mn, Ni—Mn, Ir—mn, NiO, $Fe_2O_3$ or the like can be used like the above-described materials. When this structure is used, the magnetization of the magnetization fixed layer is hardly influenced by a current magnetic field from a bit line or a word line so that the magnetization is securely fixed. Further, a leakage field (a stray field) from the magnetization fixed layer can be reduced (or adjusted), and a magnetization shift of the magnetic recording layer can be adjusted by changing the film thickness of the two ferromagnetic layers forming the magnetization fixed layer.

On the other hand, as the materials for the magnetic recording layer (the free layer), for example, Fe (iron), Co (cobalt), Ni (nickel) or alloy thereof, or oxide such as magnetite with a large spin polarizability, $CrO_2$, $RxMnO_{3-y}$ (where R represents a rare earth metal, and X represents either one of Ca (calcium), Ba (barium) and Sr (strontium)), or Heusler's alloy such as NiMnSb (nickel•manganese•antimony), PtMnSb (platinum manganese•antimony) or the like can be used like the magnetization fixed layer.

It is preferable that the ferromagnetic layer serving as the magnetic recording layer comprising these materials has a uniaxial anisotropy generally parallel to a film face. It is also preferable that the film thickness of the magnetic recording layer is in a range of 0.1 nm to 100 nm. Further, it is more preferable that the film thickness of the magnetization fixed layer is 0.4 nm or more, because it must be such a thickness that the layer does not become superparamagnetism.

Further, as the magnetic recording layer, a two-layers structure such as a soft magnetic layer/a ferromagnetic layer, or a three-layers structure such as a ferromagnetic layer/a soft magnetic layer/a ferromagnetic layer may be used. A further preferable effect such that, even if a cell width of the magnetic recording layer which is a memory cell becomes sub-micron meter or less, it is unnecessary to increase a consumption power of the current magnetic field can be obtained by using such a three-layers structure as a ferromagnetic layer/a non-magnetic layer/a ferromagnetic layer, or such a five-layers structure as a ferromagnetic layer/a non-magnetic layer/a ferromagnetic layer 2/a non-magnetic layer/a ferromagnetic layer as the magnetic recording layer to control the magnitude of the interaction between the ferromagnetic layers. At this time, the ferromagnetic layers may be different in kind and film thickness. In particular, it is more preferable that, when Co—Fe, Co—Fe—Ni, Fe rich Ni—Fe which makes MR (magenetro-resistance) large or the like is used for the ferromagnetic layer near the insulating barrier wall and Ni rich Ni—Fe, Ni rich Ni—Fe—Co or the like is used for the ferromagnetic layer which does not come in contact with the insulating layer, the switching magnetic field can be reduced while the MR is kept large. As the non-magnetic material, Ag (silver), Cu (copper), Au (gold), Al (aluminum), Ru (ruthenium), Os (osmium), Re (rhenium), Si (silicon), Bi (bismuth), Ta (tantalum), B (boron), C (carbon), Pd (palladium), Pt (platinum), Zr (zirconium), Ir (iridium), W (tungsten), Mo (molybdenum), Nb (niobium),or alloy thereof can be used.

Even in these magnetic recording layer, these magnetic substances may be added with non-magnetic element such as Ag (silver), Cu (copper), Au (gold), Al (aluminum), Ru (ruthenium), Os (osmium), Re (rhenium), Si (silicon), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), Nb (niobium), or the like so that its magnetic characteristic can be adjusted. Besides, various physical properties of the magnetic substances such as crystal properties, mechanical properties or chemical properties may be adjusted.

On the other hand, in case that the TMR element is used as the magnetoresistive effect element, as an insulating layer (or a dielectric layer) provided between the magnetization fixed layer and the magnetic recording layer, various insulating materials (dielectric materials) such as $Al_2O_3$ (aluminum oxide), $SiO_2$ (silicon oxide), MgO (magnesium oxide), AlN (aluminum nitride), $Bi_2O_3$ (bismuth oxide), $MgF_2$ (magnesium fluoride), $CaF_2$ (calcium fluoride), $SrTiO_2$ (titanium oxide•strontium), $AlLaO_3$ (lanthanum oxide•aluminum), Al—N—O (aluminum oxide and nitride) or the like can be used.

These compounds are not required to have a completely accurate composition in view of stoichiometry, and loss of oxygen, nitrogen, fluorine, or the like or excess and deficiency thereof may exist. Further, it is preferable that the thickness of the insulating layer (the dielectric layer) is thin to such an extent that a tunnel current flows through the insulating layer, and it is preferable that the thickness is 10 nm or less practically.

Such a magnetoresistive effect element can be formed on a predetermined substrate by using such ordinary thin film forming means as various sputtering processes, a vapor deposition process, a molecular beam epitaxial process or the like. As the substrate in this case, for example, Si (silicon), SiO$_2$ (silicon oxide), Al$_2$O$_3$ (aluminum oxide), spinel, AlN (aluminum nitride) or the like can be used.

Such a magnetic covering film can be formed on a predetermined substrate by using such ordinary thin film forming means as a plating process, a CVD process, an ALD process which stacks magnetic covering films in Layer-by-Layer manner by a CVD process, various sputtering processes or the like. In particular, when film formation is performed by using the plating process, the CVD process, the ALD process or the like, preferable characteristics have been obtained, because the formed film becomes more uniform than the film formed by the sputtering process. In this case, more preferable soft magnetic characteristics have been achieved by performing a post-annealing at a temperature ranging 200° C. to 400° C. to remove organic impurities or the like in the magnetic film.

Further, on the substrate, a layer comprising Ta (tantalum), Ti (titanium), Pt (platinum), Pd (palladium), Au (gold), Ti (titanium)/Pt (platinum), Ta (tantalum)/Pt (platinum), Ti (titanium)/Pd (palladium), Ta (tantalum)/Pd (palladium), Cu (copper), Al (aluminum)-Cu (copper), Ru (ruthenium), Ir (iridium), Os (osmium) or the like may be provided as an underlayer, a protective layer or the like.

Next, in order to explain an effect or advantage of the wire covered with the multi-layer yoke explained in the first to fourth embodiments, a magnetic memory cell was manufactured and comparative tests were conducted. These tests will be explained as examples.

EXAMPLE 1

A magnetic memory cell according to Example 1 is a magnetic memory cell of a simple matrix type, and has a constitution that only a lower wire (corresponding to the wire 24 in the first embodiment) was covered with a double layer yoke. A specific example of a method for manufacturing the lower wire covered with the double layer yoke will be explained with reference to FIGS. 5A to 5D. FIGS. 5A to 5D are sectional views of manufacturing steps in the method for manufacturing the lower wire according to this specific example.

First, an insulating layer 50 comprising SiO$_2$ was deposited on a substrate (not shown) where a driving circuit for a memory portion and the like had been fabricated in a lower layer by conducting plasma decomposition on TEOS (Tetra-Etoxy-Ortho-Silicate). The insulating film 50 was etched out by RIE to form a groove 51 having a predetermined pattern (refer to FIG. 5A).

Figure 5A:
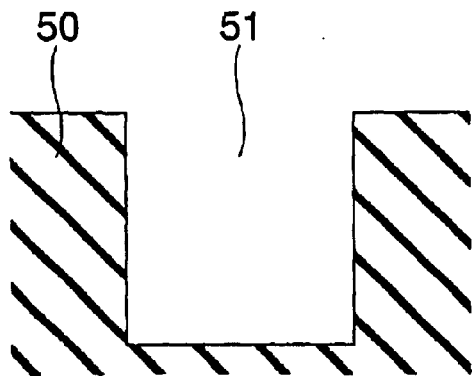
FIGS. 5A to 5D are step sectional views showing manufacturing steps of a lower wire of a magnetic memory cell according to Example 1 of the present invention.
Figure 5B:
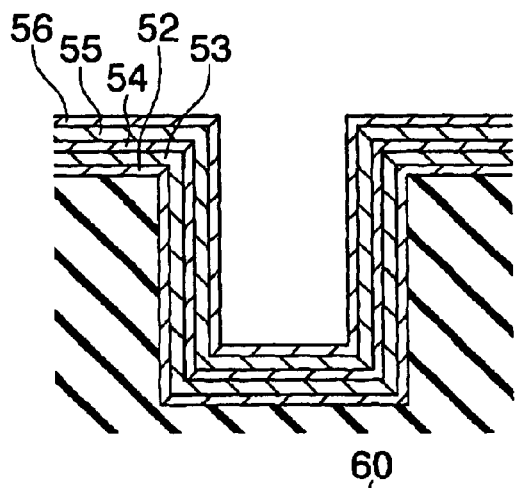

Next, as shown in FIG. 5B, a barrier metal 52 with a film thickness of 20 nm comprising TaN, a magnetic layer 53 with a film thickness of 30 nm comprising Ni$_{80}$Fe$_{20}$, a non-magnetic layer 54 with a film thickness of 10 nm comprising Ta, a magnetic layer 55 with a film thickness of 30 nm comprising Ni$_{80}$Fe$_{20}$ and a barrier metal 56 with a film thickness of 20 nm comprising Ta were sequentially deposited on surfaces of the insulating film 50 and the groove 51 by using a sputtering process.

Figure 5C:
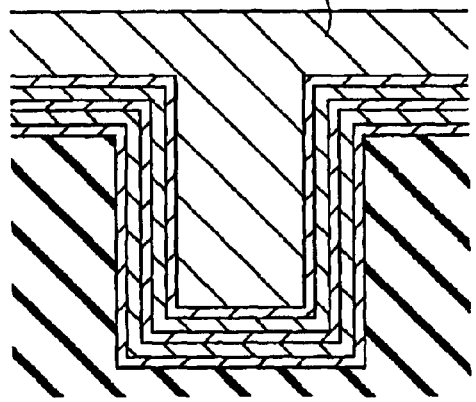

Thereafter, as shown in FIG. 5C, the groove 51 was burred with a wire material film 60 comprising, for example, Cu, for example, by a sputtering process or an electrolytic plating process.

Figure 5D:
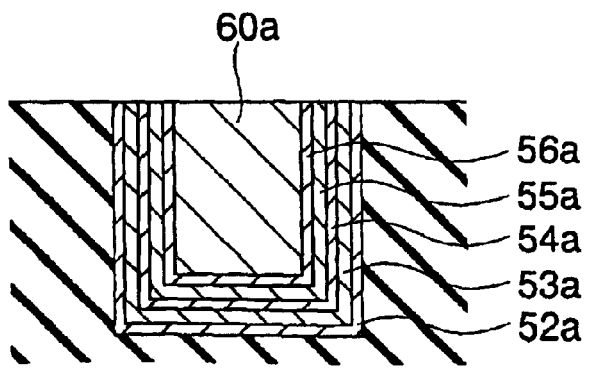

Next, a wire 60a having a double layer yoke structure was formed by removing the wire material film 60, the barrier metal 56, the magnetic layer 55, the non-magnetic layer 54, the magnetic layer 53 and the barrier metal 52, for example by using a CMP (Chemical Mechanical Polishing) method until the insulated layer 50 had been exposed (refer to FIG. 5D).

Thereafter, an insulating layer (not shown) comprising SiN was deposited, a TMR element (not shown) was subsequently formed on a lower wire 60a, a upper wire (not shown) corresponding to the wire 6 in the first embodiment was formed on the TMR element. Thus, a magnetic memory cell of Example 1 was formed.

Incidentally, the TMR element was manufactured by using an eximer stepper and an ion milling. Ta was used for a covering layer and Ta/Cu/Ta was used for an upper electrode. Formation of the ferromagnetic layer was made in a magnetic field. The constitution of the TMR element manufactured is Ta (5 nm)/Ir—Mn (10 nm)/Co—Fe (3 nm)/Ru (1 nm)/Co—Fe (3 nm) /AlOX (2 nm) /Ni—Fe (3 nm)/Ta (5 nm)/Cu (50 nm) /Ta (10 nm).

Here, each bracketed numeral indicates a film thickness. Regarding the. TMR element, the film thickness of the insulating film comprising SiN was set to 20 nm in order to shorten the distance between the yoke wire and the TMR element, thereby manufacturing the magnetic memory cell of Example 1 where the yoke and the TMR element had been shortened.

Further, in the above Example 1, a magnetic memory cell of a Modified Example having Ni$_{80}$Fe$_{20}$ with a thickness of 30 nm serving as the magnetic layer 53, TaN with a thickness of 10 nm serving as the non-magnetic layer 54, and Co$_{70.5}$Fe$_{4.5}$Si$_{15}$B$_{10}$ with a thickness of 30 nm serving the magnetic layer 55 was manufactured. That is, Example 1 and Modified Example thereof were different in only materials for the non-magnetic layer 54 and the magnetic layer 55.

For comparison, in Example 1 and Modified Example, magnetic memory cells where the lower wire was covered with a single layer yoke were manufactured as Comparative Example 1 and Comparative Example 2. That is, Comparative Example 1 had a structure that the lower wire was covered with a magnetic layer with a thickness of 30 nm comprising Ni$_{80}$Fe$_{20}$, and Comparative Example 2 had a structure that the lower wire was covered with a magnetic layer with a thickness of 30 nm comprising a film of Co$_{70.5}$Fe$_{4.5}$Si$_{15}$B$_{10}$.

A method for forming the magnetic memory cells according Comparative Example 1 and Comparative Example 2 will be explained with reference to FIGS. 6A to 6D. FIGS. 6A to 6D are sectional views showing manufacturing steps for the magnetic memory cell according to Comparative Example 1 and Comparative Example 2.

Figure 6A:
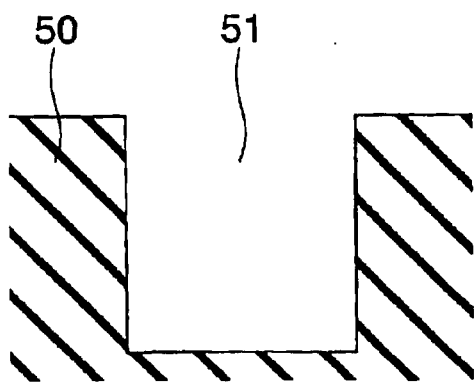
FIGS. 6A to 6D are step sectional views showing manufacturing steps of a lower wire of a magnetic memory cell according to a comparative example.
Figure 6B:
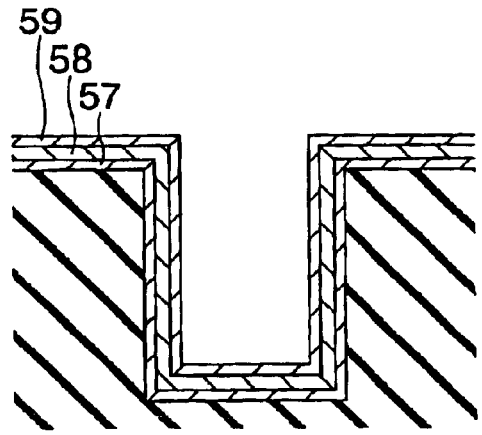
Figure 6C:
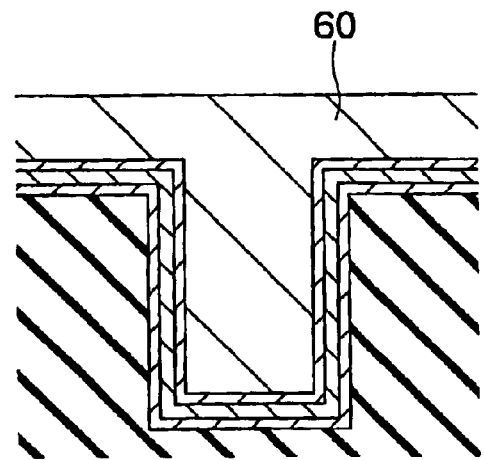
Figure 6D:
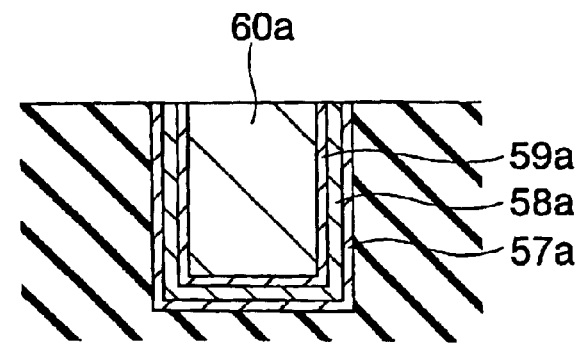

Like the case of the above-described Example 1, first, an insulating film 50 comprising SiO$_2$ was deposited on a substrate (not shown) where a driving circuit for a memory portion and the like had been fabricated in a lower layer. The insulating film 50 was etched out by RIE to form a groove 51 having a predetermined pattern (refer to FIG. 6A). Next, as shown in FIG. 6B, TaN with a thickness of 20 nm serving as a barrier metal 57, Ni$_{80}$Fe$_{20}$ with a thickness of 30 nm serving as a magnetic layer 58, Ta with a thickness of 20 nm serving as a barrier metal 59 were sequentially deposited on surfaces of the insulating layer 50 and the groove 51 by using a sputtering process. Thereafter, as shown in FIG. 6C, the groove 51 was burred with a wire material film 60 comprising, for example, Cu, for example, by a sputtering process or an electrolytic plating process. Next, a wire 60a having a double layer yoke structure was formed by removing the wire material film 60, the barrier metal 59, the magnetic layer 58 and the barrier metal 57, for example by using a CMP (Chemical Mechanical Polishing) method until the insulated layer 50 had been exposed (refer to FIG. 6D).

Thereafter, an insulating layer (not shown) comprising SiN was deposited, a TMR element (not shown) was subsequently formed on the lower wire 60a, an upper wire (not shown) was formed on the TMR element. Thus, a magnetic memory cell of Comparative Example 1 was formed. Comparative Example 2 had a structure that the material for the magnetic layer se in Comparative Example 1 was replaced from $Ni_{80}Fe_{20}$ to $Co_{70.5}Fe_{4.5}Si_{15}B_{10}$.

100 magnetic memory cells were manufactured for each of the above Example 1, Modified Example, and Comparative Examples 1 and 2 and these cells were annealed in a magnetic field, so that fluctuations in switching magnetic field were evaluated. In the evaluation of the fluctuations in switching magnetic field, evaluation of fluctuations in switching magnetic field $dH_c$ and offset magnetic field $dH_{off}$ was made by measuring a MR curve using an auto-prober and performing statistical processing. The evaluation results are shown in FIG. 7. The numerical values shown in FIG. 7 show values of $2\sigma$ of the switching magnetic field $dH_c$ and the offset magnetic field $dH_{off}$. Here, a indicates standard deviation. As is understood in FIG. 9, in case that a double layer yoke structure such as Example 1 and Modified Example was used, both the fluctuations in the switching magnetic field and the fluctuations in the offset magnetic field were reduced as compared with the case of a single layer yoke structure such as Comparative Examples 1 and 2, which demonstrates desirable results.

EXAMPLE 2

A magnetic memory cell according to Example 2 is a magnetic memory cell of a simple matrix type, and has a constitution that only an upper wire (corresponding to the wire 6 in the first embodiment) was covered with a double layer yoke. A specific example of a method for manufacturing the upper wire covered with the double layer yoke will be explained with reference to FIGS. 8A to 8E. FIGS. 8A to 8E are sectional views of manufacturing steps in the method for manufacturing the upper wire according to this specific example.

First, a lower wire (not shown) comprising Ta/Cu/Ta was manufactured on a TMR element (not shown). A tunnel junction was manufactured by using an eximer stepper and an ion milling. Ta was used in a covering layer. Formation of a ferromagnetic layer was conducted in a magnetic field.

The TMR element manufactured comprises Ta (5 nm)/Cu (30 nm)/Ta (5 nm)/Ir—Mn (10 nm)/Co—Fe (3 nm)/Ru (1 nm)/Co—Fe (3 nm)/AlO$_x$ (2 nm)/Ni—Fe (3 nm)/Ta (5 nm). Here, each bracketed numeral indicates a film thickness.

Figure 8A:
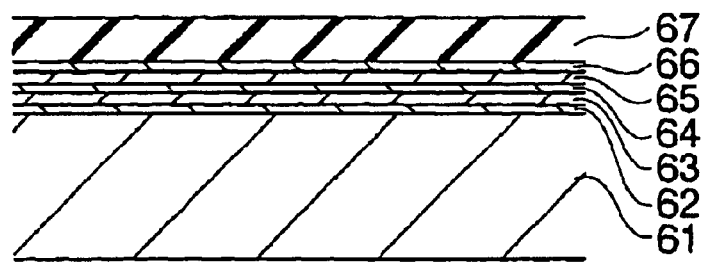
FIGS. 8A to 8E are step sectional views showing manufacturing steps of an upper wire of Example 2 of the present invention.

After the TMR element was manufactured in the lower layer, as shown in FIG. 8A, a wire material film 61 comprising Ti/Al—Cu/Ti and serving as an upper layer, a barrier metal 62 with a film thickness of 20 nm comprising TaN, a magnetic layer 63 with a film thickness of 30 nm comprising $Ni_{81}Fe_{19}$, a non-magnetic layer 64 with a film thickness of 10 nm comprising Ta, a magnetic layer 65 with a film thickness of 30 nm comprising $Ni_{81}Fe_{19}$, and a barrier metal 66 with a film thickness of 20 nm comprising Mo were sequentially deposited by using sputtering process in a state that an upper electrode of the TMR element was exposed such that the TMR element and the upper wire were electrically connected to each other. Further, an etching mask material 67 with a film thickness of 150 nm comprising $SiO_2$ was deposited on the barrier metal 66.

Figure 8B:
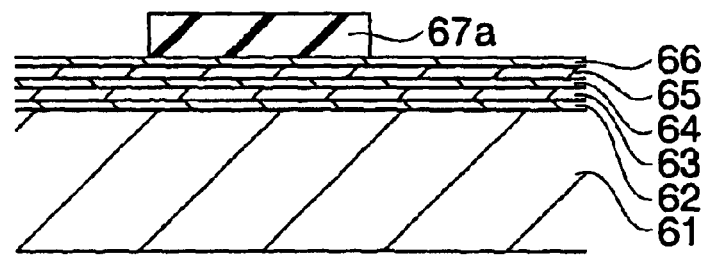

Next, the etching mask material 67 comprising $SiO_2$ was processed to a predetermined pattern by RIE using, for example, $CHF_3$ as etching gas to form an etching mask 67a (refer to FIG. 8B).

Figure 8C:
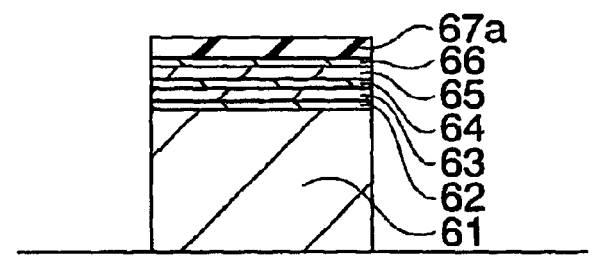

As shown in FIG. 8C, using the etching mask 67a, etching was then conducted from the barrier metal 66 which is a top layer down to the wire material film 61. In this embodiment, etching was conducted by RIE using argon and chloride while a gas ratio was changed properly.

Figure 8D:
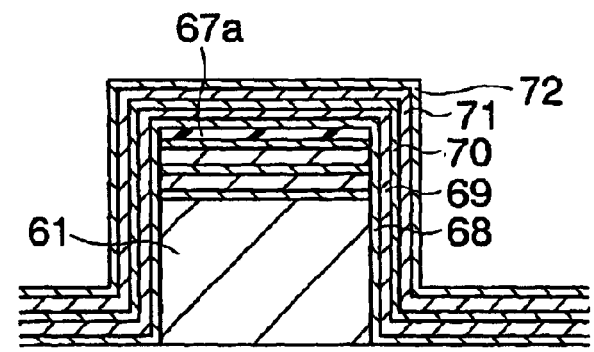

As shown in FIG. 8D, thereafter, a barrier metal 68 with a film thickness of 20 nm comprising TaN, a magnetic layer 69 with a film thickness of 30 nm comprising $Ni_{81}Fe_{19}$, a non-magnetic layer 70 with a film thickness of 10 nm comprising Ta, a magnetic layer 71 with a film thickness of 30 nm comprising $Ni_{81}Fe_{19}$, and a barrier metal 72 with a film thickness of 20 nm comprising Ta were sequentially deposited by using sputtering process.

Figure 8E:
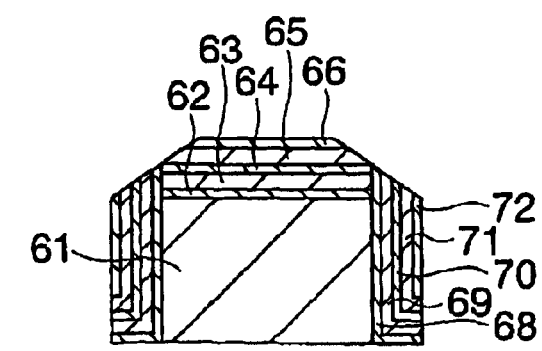

When etching-out was again conducted from the barrier metal 72 which was a flat portion down to the barrier metal 68 by using anisotropy of RIE from the top layer and the etching mask 67a was removed, a side wall portion remained without being etched, as shown in FIG. 8E. Thus, a magnetic memory cell of Example 2 with a wire of a double layer yoke structure was formed.

As shown in FIG. 8E, etching was adjusted such that a corner of the upper portion of the wire could be removed to some extent. The shape of the corner can be controlled by adjusting an etching rate ratio of the mask 67a comprising $SiO_2$.

Further, in this Example 2, a magnetic memory cell of Modified Example where the materials for the magnetic layers 65 and 71 were respectively changed from $Ni_{81}Fe_{19}$ to $Co_{87}Nb_5Zr_8$ and the materials for the non-magnetic layers 64 and 70 were respectively changed from Ta to TaN was manufactured. That is, Example 2 and Modified Example of Example 2 are different in only materials of the magnetic layers 65 and 71 and the non-magnetic layers 64 and 70.

For comparison, in Example 2 and Modified Example thereof, magnetic memory cells where the upper wire was covered with a single layer yoke were manufactured as Comparative Example 1 and Comparative Example 2. That is, Comparative Example 1 has a structure that the upper wire was covered with a magnetic layer with a thickness of 30 nm comprising $Ni_{81}Fe_{19}$, and Comparative Example 2 has a structure that the upper wire was covered with a magnetic layer with a thickness of 30 nm comprising a film of $Co_{87}Nb_5Zr_8$. Incidentally, in Example 2, Modified Example thereof, and Comparative Examples 1 and 2, the Ta film and the yoke above the TMR element were caused to approach up to 30 nm.

100 magnetic memory cells were manufactured for each of Example 2, Modified Example thereof, and Comparative Examples 1 and 2 and these cells were annealed in a magnetic field, so that fluctuations in switching magnetic field were evaluated. In the evaluation of the fluctuations in switching magnetic field, evaluation of fluctuations in switching magnetic field $dH_c$ and offset magnetic field $dH_{off}$ was made by measuring a MR curve using an auto-prober and performing statistical processing. The evaluation results are shown in FIG. 9. The numerical values shown in FIG. 9 show values of $2\sigma$ of the switching magnetic field $dH_c$ and the offset magnetic field $dH_{off}$. Here, σ indicates standard deviation. As is understood, in case that a double layer yoke structure such as Example 2 and Modified Example thereof was used, both the fluctuations in the switching magnetic field and the fluctuations in the offset magnetic field were reduced as compared with the case of a single layer yoke structure such as Comparative Examples 1 and 2, which demonstrates desirable results.

EXAMPLE 3

A magnetic memory cell according to Example 3 is a magnetic memory cell of a simple matrix type, and has a constitution that only an upper wire (corresponding to the wire 6 in the first embodiment) was covered with a double layer yoke. A specific example of a method for manufacturing the upper wire covered with the double layer yoke will be explained with reference to FIGS. 10A to 10G. FIGS. 10A to 10G are sectional views of manufacturing steps in the method for manufacturing the upper wire according to this specific example.

The manufacturing method of this specific example is for forming a double layer yoke automatically by utilizing re-deposition of a side wall.

Figure 10A:
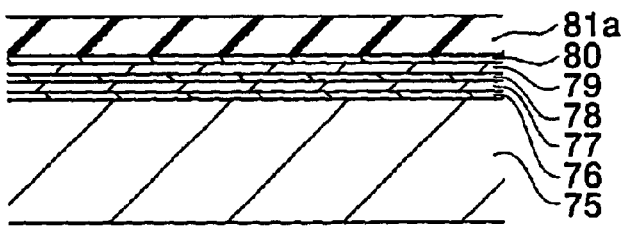
FIGS. 10A to 10G are step sectional view showing manufacturing steps of an upper wire of a magnetic memory cell according to Example 3 of the present invention.

First, like the case of Example 2, as shown in FIG. 10A, a wire material film 75 comprising Ti/Al—Cu/Ti, a barrier metal 76 with a film thickness of 20 nm comprising TaN, a magnetic layer 77 with a film thickness of 30 nm comprising $Ni_{81}Fe_{19}$, a non-magnetic layer 78 with a film thickness of 10 nm comprising Ta, a magnetic layer 79 with a film thickness of 30 nm comprising $Ni_{81}Fe_{19}$, and a barrier metal 80 with a film thickness of 20 nm comprising Ta were sequentially deposited by using sputtering process in a state that an upper electrode of the TMR element had been exposed. Further, an etching mask material 81 with a film thickness of 150 nm comprising $SiO_2$ was deposited on the barrier metal 80 (refer to FIG. 10A).

Figure 10E:
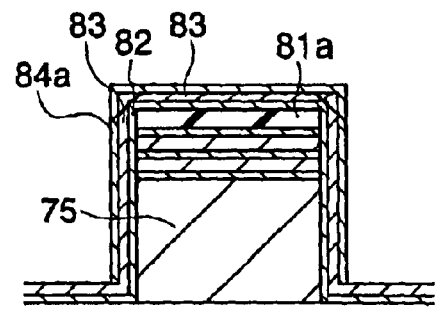
Figure 10B:
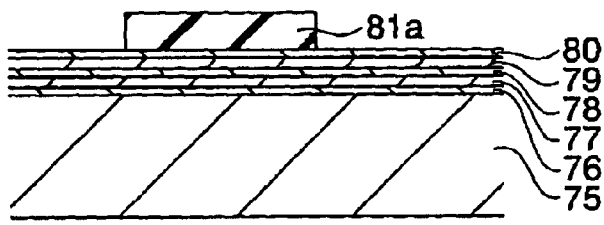

Next, the etching mask material 81 comprising $SiO_2$ was processed to a predetermined pattern by RIE using, for example, $CHF_3$ as etching gas to form an etching mask 81*a* (refer to FIG. 10B).

Figure 10F:
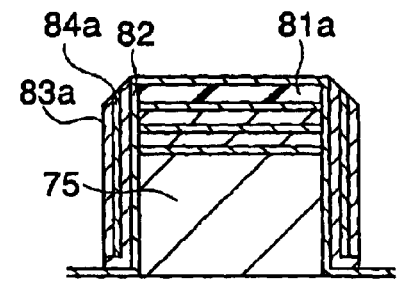
Figure 10C:
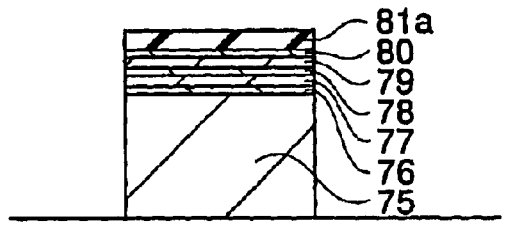

As shown in FIG. 10C, using the etching mask 81*a*, etching was then conducted from the barrier metal 80 which is an upper layer down to the wire material film 75 which is a lower layer. In this embodiment, etching was conducted by RIE using argon and chloride while a gas ratio was changed properly.

Figure 10G:
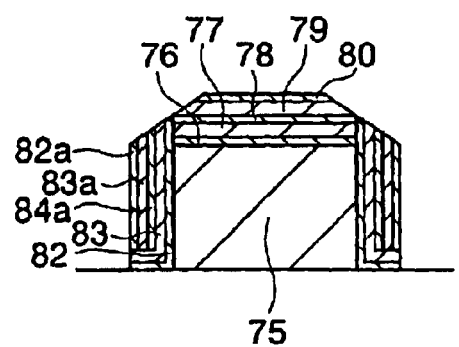
Figure 10D:
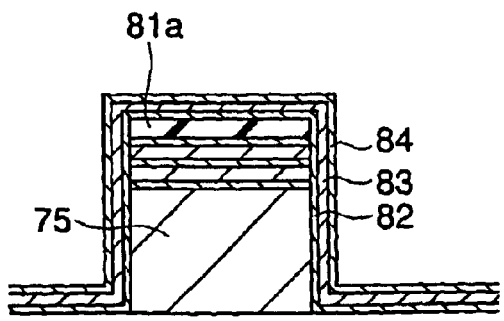

As shown in FIG. 10D, thereafter, a barrier metal 82 with a film thickness of 20 nm comprising TaN, a magnetic layer 83 with a film thickness of 30 nm comprising $Ni_{81}Fe_{19}$, and a barrier metal 84 with a film thickness of 20 nm comprising Ta were sequentially deposited by using sputtering process.

Next, etching-out was conducted from the barrier metal 84 which was a flat portion to the barrier metal 82 utilizing anisotropy of RIE, where the material etched out at the flat portion was re-deposited on the side wall portion, for example by etching Ar mainly in a sputter etching mode, as shown in FIGS. 10E, 10F and 10G. That is, in FIG. 10E, the barrier metal 84 which was the upper layer shown in FIG. 10D was removed except for the side wall portion and the etched-out barrier metal was re-deposited on the side wall portion to form a barrier metal 84*a* of the side wall portion. Further, in FIG. 10F, the magnetic layer 83 which was an upper layer shown in FIG. 10E was etched except for a side wall portion and the etched-out magnetic layer was re-deposited on a side wall portion to form a magnetic layer 83*a* of the side wall portion. Furthermore, in FIG. 10G, the barrier metal 82 which was an upper layer shown in FIG. 10F was etched except for a side wall portion so that the etched-out barrier metal formed a barrier metal 82*a* of the side wall portion. Thereafter, the etching mask 81*a* was removed so that a magnetic memory cell according to Example 3 was completed.

Thus, the magnetic memory cell of Example 3 having a wire of a double layer yoke structure comprising the double layer magnetic layers 83 and 83*a* finally stacked on the side wall portion via the barrier metals (non-magnetic bodies) 84 and 84*a* comprising Ta can be formed even if a sputtered magnetic layer 83 on the side wall portion comprises one layer.

In this Example 3, a magnetic memory cell of Modified Example where the materials for the magnetic layers 83 and 83*a* were respectively changed from $Ni_{81}Fe_{19}$ to $Fe_{90}Cu_1Zr_7B_2$ and the materials for the barrier metals (non-magnetic bodies) 84 and 84*a* were respectively changed from Ta to TaN was manufactured. That is, Example 3 and Modified Example thereof are different in only materials for the magnetic layers 83 and 83*a* and the non-magnetic layers 84 and 84*a*.

For comparison, in Example 3 and Modified Example thereof, magnetic memory cells where the upper wire was covered with a single layer yoke were manufactured as Comparative Example 1 and Comparative Example 2. That is, Comparative Example 1 has a structure that the upper wire was covered with a magnetic layer with a thickness of 30 nm comprising $Ni_{81}Fe_{19}$, and Comparative Example 2 has a structure that the upper wire was covered with a magnetic layer with a thickness of 30 nm comprising $Fe_{90}Cu_1Zr_7B_2$. Incidentally, in Example 3, Modified Example thereof, and Comparative Examples 1 and 2, the Ta film and the yoke above the TMR element were caused to approach up to 30 nm.

100 magnetic memory cells were manufactured for each of Example 3, Modified Example thereof, and Comparative Examples 1 and 2 and these cells were annealed in a magnetic field, so that fluctuations in switching magnetic field were evaluated. In the evaluation of the fluctuations in switching magnetic field, evaluation of fluctuations in switching magnetic field $dH_c$ and offset magnetic field $dH_{off}$ was made by measuring a MR curve using an auto-prober and performing statistical processing. The evaluation results are shown in FIG. 11. The numerical values shown in FIG. 11 show values of $2\sigma$ of the switching magnetic field $dH_c$ and the offset magnetic field $dH_{off}$. Here, $\sigma$ indicates standard deviation. As is understood from FIG. 11, in case that a double layer yoke structure such as Example 3 and Modified Example thereof was used, both the fluctuation in the switching magnetic field and the fluctuation in the offset magnetic field were reduced as compared with the case of a single layer yoke structure such as Comparative Examples 1 and 2, which demonstrates desirable results.

Figure 12:
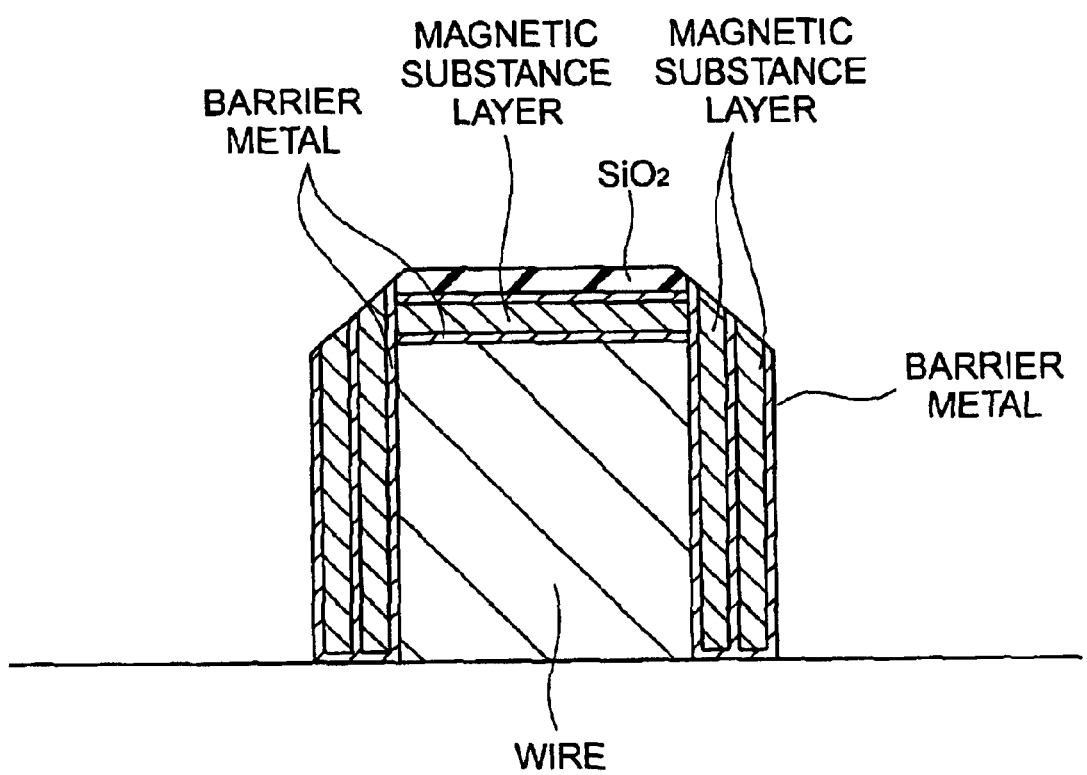
FIG. 12 is a view showing a constitution of a second modified example of Example 2 or Example 3.

In the above-described Examples 2 and 3, such a constitution was employed that magnetic layers were stacked on an upper portion in a double layer manner but it is possible to employ such a constitution that an upper magnetic layer comprises one layer and only a side wall portion comprises double layers, as shown in FIG. 12.

EXAMPLE 4

Example where a dual flat face yoke structure is provided adjacent to a TMR element will be explained as a magnetic memory cell of Example 4 with reference to FIGS. 13A and 13B.

Like the case of the second embodiment shown in FIGS. 2A to 2C, it is not required to bring a double layer magnetic layer in close contact with a wire necessarily. The double layer magnetic layer may be present as one portion of a yoke on the same plane as a TMR element and the portion may have a double layer structure. This structure is effective when a distance between the TMR element and the yoke wire is more than 0.1 µm.

Figure 13:
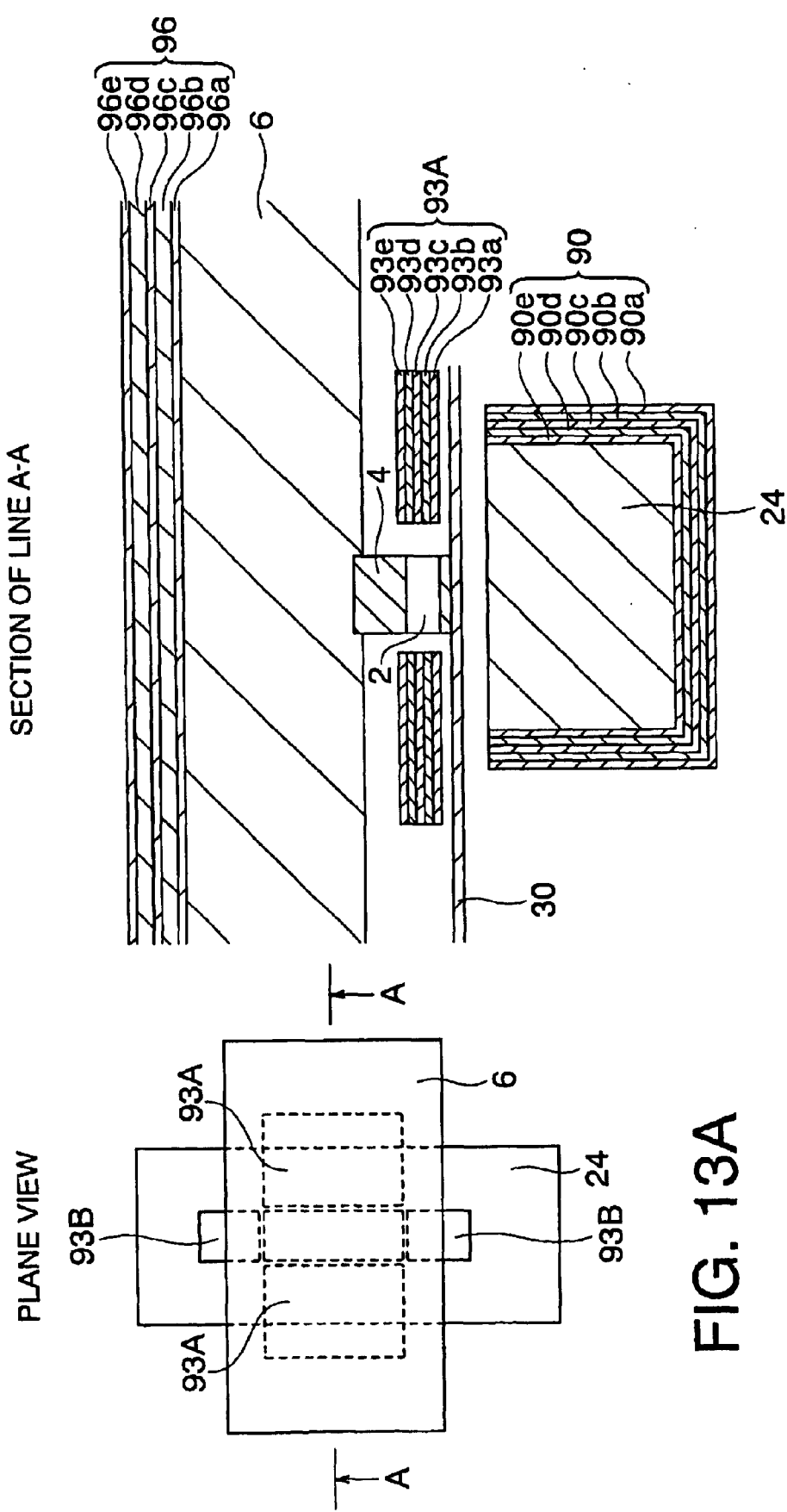
FIGS. 13A to 13B are views showing a constitution of a magnetic memory cell according to Example 4 of the present invention.

As shown in FIGS. 13A and 13B, a lower wire 24 covered with a double layer yoke 90 comprising a barrier metal 90a, a ferromagnetic layer 90b, a non-magnetic layer 90c, a ferromagnetic layer 90d and a barrier metal 90e is formed. Thereafter, an insulating film (not shown) is formed and a lead electrode 30 is formed on the insulating film. A TMR element 2 is formed on the lead electrode. Subsequently, double layer yokes 93A and 93B where an insulating film comprising, for example, $SiO_2$ is formed so as to surround the TMR element 2. Thereafter, a barrier metal 93a with a film thickness of 10 nm comprising Ta, a ferromagnetic layer 93b with a film thickness of 30 nm comprising $Ni_{81}Fe_{19}$, a non-magnetic layer 93c with a film thickness of 10 nm comprising Ta, a ferromagnetic layer 93d with a film thickness of 30 nm comprising $Ni_{81}Fe_{19}$ and a barrier metal layer 93e with a film thickness of 10 nm comprising Ta are sequentially stacked are formed on generally the same face as the TMR element 2. The double layer yoke 93A is a yoke for a lower wire 24, and the double layer yoke 93B is a yoke for an upper wire 6.

Subsequently, an insulating film (not shown) is deposited on a whole surface, an opening connected to the TMR element 2 is formed in this insulating film, and a connection plug 4 is formed by filling the opening with conductive material. Thereafter, an upper wire 6 covered with a double layer yoke 96 comprising a barrier metal 96a, a ferromagnetic layer 96b, a non-magnetic layer 96c, a ferromagnetic layer 96d and a barrier layer 96e is formed, thereby completing a magnetic memory cell of Example 4.

In this Example 4, a magnetic memory cell where the material for the ferromagnetic layer 93d constituting the double layer yoke 93A, 93B was composed of $Co_{87}Nb_5Zr_8$ and the material for the non-magnetic layer 93c was composed of TaN was manufactured as Modified Example of the Example 4.

For comparison, a magnetic memory cell where the above double layer yoke 93A, 93B in Example 4 was replaced with a single layer yoke with a film thickness of 30 nm comprising $Ni_{81}Fe_{19}$ was manufactured as Comparative Example 1, and a magnetic memory cell where the above double layer yoke 93A, 93B in Example 4 was replaced with single layer yoke with a thickness of 30 nm comprising $Co_{87}Nb_5Zr_8$ was manufactured as Comparative Example 2. Incidentally, in Example 4, Modified Example thereof, and Comparative Examples 1 and 2, a distance between an upper portion of the TMR element 2 and the double layer yoke 93A, 93B was caused to approach up to 30 nm.

100 magnetic memory cells were manufactured for each of Example 4, Modified Example thereof, and Comparative Examples 1 and 2 and these cells were annealed in a magnetic field, so that fluctuations in switching magnetic field were evaluated. In the evaluation of the fluctuations in switching magnetic field, evaluation of fluctuations in switching magnetic field $dH_c$ and offset magnetic field $dH_{off}$ was made by measuring a MR curve using an auto-prober and performing statistical processing. The evaluation results are shown in FIG. 14. The numerical values shown in FIG. 14 show values of $2\sigma$ of the switching magnetic field $dH_c$ and the offset magnetic field $dH_{off}$. Here, $\sigma$ indicates standard deviation. As is understood from FIG. 14, in case that a double layer yoke structure such as Example 4 and Modified Example thereof was used, both the fluctuations in the switching magnetic field and the fluctuations in the offset magnetic field were reduced as compared with the case of a single layer yoke structure such as Comparative Examples 1 and 2, which demonstrates desirable results.

Next, a specific example of architecture of a magnetic memory according to the present invention will be explained with reference to FIG. 15 to FIG. 18.

Figure 15:
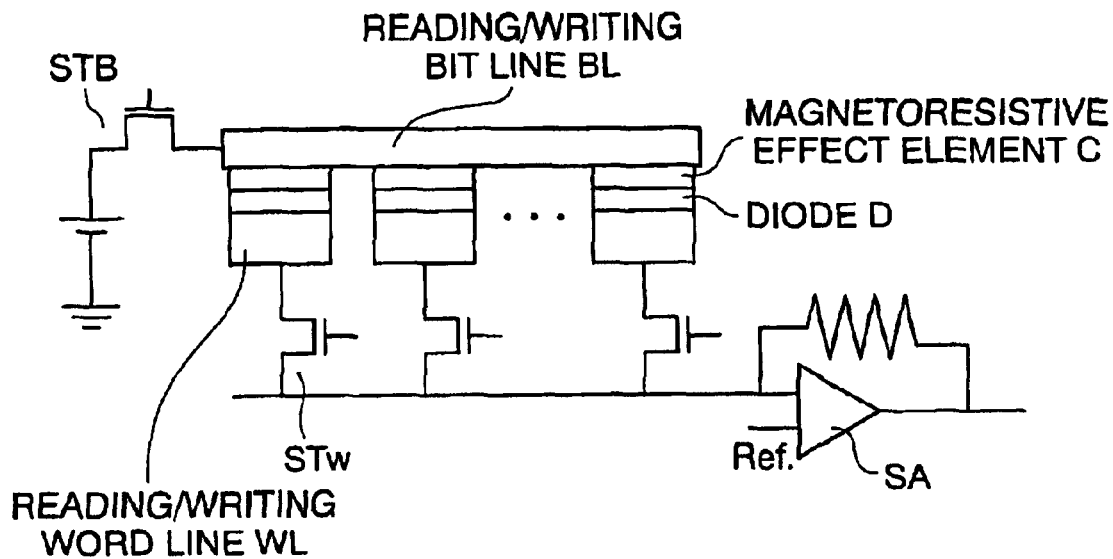
FIG. 15 is a diagram showing a first specific example of an architecture of a magnetic memory.

FIG. 15 is an illustrative diagram showing architecture of a first specific example of a magnetic memory. That is, the same figure shows a sectional structure of a memory array. In this architecture, a plurality of TMR elements C are connected to a bit line for reading/writing BL in parallel. A word line for reading/writing WL is connected to the other ends of the respective TMR elements C via diodes D. Further, such a constitution that each word line WL is connected to a sense amplifier SA via a selecting transistor STw for selecting each word line WL is employed. Furthermore, the bit line for reading/writing BL is grounded via a selecting transistor STB for selecting the bit line BL is employed.

In the magnetic memory of the first specific example shown in FIG. 15, a bit line BL and a word line WL connected to a targeted TMR element C are respectively selected by the selecting transistors STB and STw at a reading time, and a current is detected by the sense amplifier SA. Further, a bit line BL and a word line WL connected to a targeted TMR element C are selected by the selecting transistors STB and STw at a writing time, and a writing current is caused to flow. At this time, a writing magnetic field obtained by composing magnetic fields generated in the bit line BL and the word line WL respectively directs magnetization of a storage layer of the TMR element C in a predetermined direction so that writing can be conducted.

The diode D serves so as to cut off a by-pass current flowing via other TMR elements arranged in a matrix manner at a reading time or a writing time.

Next, a second specific example of architecture of a magnetic memory will be explained with reference to FIG. 16.

Figure 16:
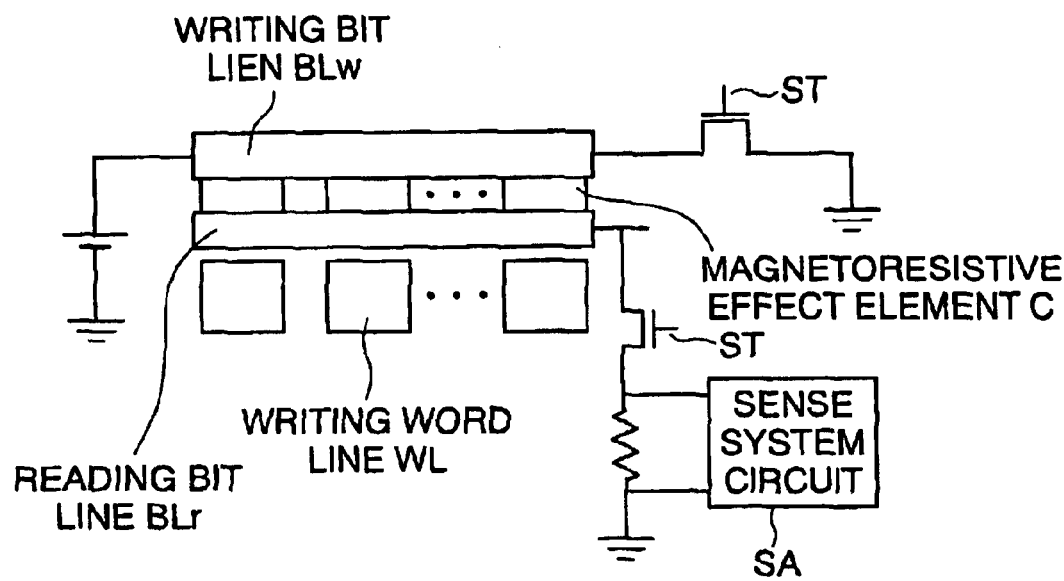
FIG. 16 is a diagram showing a second specific example of an architecture of a magnetic memory.

FIG. 16 is an illustrative diagram showing the second specific example of architecture where a memory array can be constituted in a stacking manner. That is, the same figure shows a sectional view of a memory array.

In this architecture, a constitution of "a ladder type" where a plurality of TMR elements C are connected in parallel between a bit line for reading/writing BLw and a bit line BLr for reading is employed. Further, a word lines for writing WL are wired in the vicinity of the respective TMR elements C in a direction crossing the bit line BLw.

Writing in the TMR element can be performed by applying a composite magnetic field of a magnetic field generated by causing a writing current to flow in the bit line for reading/writing BLw and a magnetic field generated by causing a writing current to flow in the word line for writing WL to the storage layer of the TMR element.

On the other hand, when reading is performed, a voltage is applied between the bit lines BLw and the BLr. Thereby, currents flow in all the TMR elements connected in parallel between the bit lines BLw and BLr. While the sum of the currents is detected by the sense amplifier, a writing current is applied to a word line WL near the targeted TMR element so that the magnetization of the storage layer in the targeted TMR element is rewritten to a predetermined direction. By detecting a current fluctuation at this time, reading of the targeted TMR element can be performed.

That is, when the magnetization direction of the storage layer before rewriting and the magnetization direction thereof after rewriting are the same, a current detected by the sense amplifier SA does not vary. However, when the magnetization direction of the storage layer is reversed before and after rewriting, a current detected by the sense amplifier SA vary due to magnetoresistive effect. Thus, the magnetization direction of the storage layer before rewriting, storage data can be read out. Incidentally, this method corresponds to a case that storage data is destroyed at a reading time, the so-called "destructive reading-out".

On the other hand, when such a structure as a magnetization free layer/a tunnel barrier layer/a magnetic storage layer is applied to the constitution of the TMR element, "a non-destructive reading-out" can be performed. That is, when a TMR element having this structure is employed, the magnetization direction is recorded in the storage layer, and the magnetization direction of the storage layer can be read out at a reading time by changing the magnetization direction of the magnetization free layer properly to compare sense currents with each other. In this case, it is necessary to employ such a design that a magnetization reversing magnetic field of the magnetization free layer becomes smaller than a magnetization reversing magnetic field of the storage layer.

Figure 17:
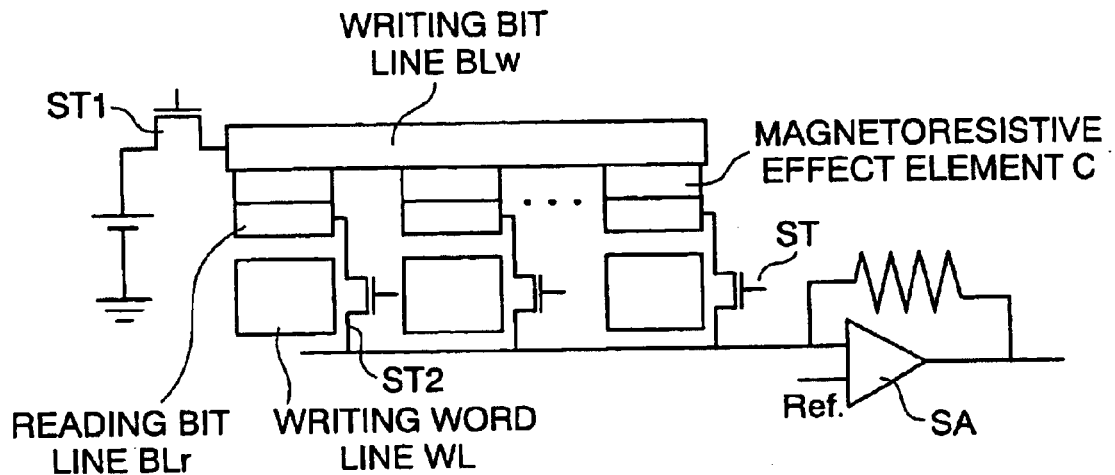
FIG. 17 is a diagram showing a third specific example of an architecture of a magnetic memory.

FIG. 17 is an illustrative diagram showing a third specific example of architecture of a magnetic memory. That is, the same figure shows a sectional structure of a memory array.

In this architecture, a plurality of TMR elements C are connected in parallel to a bit line BLw for reading/writing, and the other ends of the TMR elements C are connected with respective bit lines for reading BLr in a matrix manner. Further, word lines for writing WL are wired in the vicinity of the bit lines for reading BLr in parallel therewith.

Writing into the TMR element can be performed by applying a composite magnetic field of a magnetic field generated by causing a writing current to flow in the bit line for reading/writing BLw and a magnetic field generated by causing a writing current to flow in the word line for writing WL to the storage layer of the TMR element.

On the other hand, when reading is performed, a sense current is caused to flow in a target TMR element to detect the same by the sense amplifier SA by selecting the writing bit line BLw and the reading bit line BLr by the selecting transistor.

Next, a fourth specific example of architecture of a magnetic memory will be explained with reference to FIG. 18.

Figure 18:
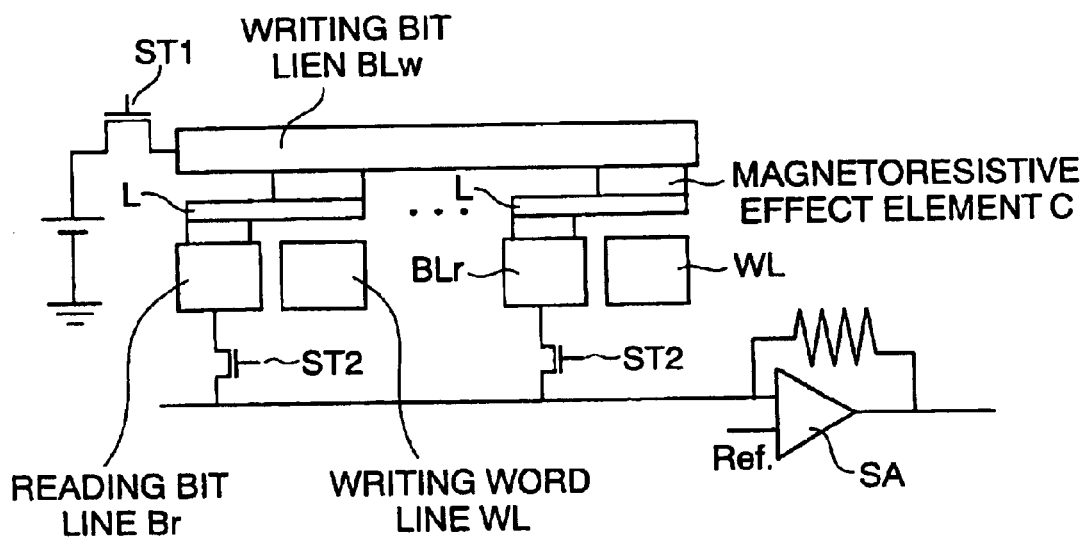
FIG. 18 is a diagram showing a fourth specific example of an architecture of a magnetic memory.

FIG. 18 is an illustrative diagram showing a fourth specific example of architecture of a magnetic memory. That is, the same figure shows a sectional structure of a memory array. This specific example is different from the third specific example in that a bit line for reading BLr is connected to a TMR element C via a lead L and a word line for writing WL is wired just below a TRM element C. By employing this structure, the TMR element C and the writing word line WL can be made closer to each other than the structure shown in FIG. 17. As a result, a writing magnetic field from the word line WL can be applied to the TMR element more effectively.

In the above, the embodiments of the present invention have been explained with reference to the specific examples. However, the present invention is not limited to these specific examples. For example, regarding specific materials, film thicknesses, shapes, sizes of the ferromagnetic layer, the insulating layer, the anti-ferromagnetic layer, the non-magnetic metal layer, the electrode and the like constituting the magnetoresistive effect element, ones may be included in the scope of the present invention when they can be applied for implementing the present invention to achieve a similar effect by proper selection conducted by those skilled in the art.

Similarly, regarding a structure, a material, a shape and a size of each element constituting the magnetic memory of the present invention, ones can be included in the scope of the invention when they can be applied for implementing the present invention to achieve a similar effect or advantage by proper selection conducted by those skilled in the art.

Further, the present invention is similarly applicable to a recording head or a magnetic reproducing apparatus of not only a longitudinal magnetic recording system but also a vertical magnetic recording system to achieve a similar effect.

Besides, all magnetic memories which can be design-modified and implemented by those skilled in the art on the basis of the magnetic memories described above as the embodiments of the present invention belong to the scope of the present invention similarly.

As described above, according to embodiments of the present invention, a consumption power can be reduced and fluctuations in values of a switching magnetic field magnetic field of a TMR element can be suppressed.

What is claimed is:

1. A magnetic memory comprising:
   at least one wire; a magnetoresistive effect element having a storage layer whose magnetization direction varies according to a current magnetic field generated by causing a current to flow in the wire; and first yokes which are provided so as to be spaced from at least one pair of opposed side faces of the magnetoresistive effect element to form a magnetic circuit in cooperation with the magnetoresistive effect element when a current is caused to flow in the wire, each of the first yokes having at least two soft magnetic layers which are stacked via a non-magnetic layer.

2. The magnetic memory according to claim 1, wherein the first yokes are provided so as to correspond to four side faces of the magnetoresistive effect element.

3. The magnetic memory according to claim 1, wherein the non-magnetic layer of each of the first yokes has a film thickness thinner than a shortest distance between an end portion of the first yoke and an end portion of the magnetoresistive effect element.

4. The magnetic.memory according to claim 1, wherein the soft magnetic layer is one of a Ni—Fe alloy layer, a Co—Fe—Ni alloy layer, amorphous magnetic layer, and a micro-crystal ferromagnetic layer, and the amorphous magnetic layer or the mico-crystal ferromagnetic layer is formed of any one selected from the group of Co—Fe—AA, Co—Fe—AA—AA2, Fe—AA—AA2, Co—AA—AA2, Co—Mn—AA—AA2, Fe—Cu—AA—AA2, and Co—Fe—Ni—AA, where AA or AA2 comprises at least one selected from the group of B, Si, Ge, Zr, Nb, P, Mo, Ta, N, C, Ti, Al, W, V or rare earth elements.

5. The magnetic memory according to claim 1, wherein the non-magnetic layer comprises at least one element selected from the group of Al, Ga, In, Si, Ge, Ti, Zr, Hf, V, Nb, Ta, Cr, Mo, W, Cu, Zn, Ag, Au, Ru, Re, Os, or alloy thereof, oxide or nitride thereof.

6. The magnetic memory according to claim 1, wherein an interaction between the soft magnetic layers of the first yoke is in a range between –2000 Oe and 500 Oe.

7. The magnetic memory according to claim 1, wherein the magnetoresistive effect element comprises a tunneling magnetoresistive effect element.

8. The magnetic memory according to claim 1, further comprising a selecting transistor for reading out recorded information stored in the storage layer of the magnetoresistive effect element.

9. The magnetic memory according to claim 1, further comprising a second yoke which is formed so as to cover the wire and which has at least two soft magnetic layers stacked via a non-magnetic layer.

10. A magnetic memory comprises:
at least one wire; a magnetoresistive effect element having a storage layer whose magnetization direction varies according to a current magnetic field generated by causing a current to flow in the wire; and a yoke which is provided at least on both side faces of the wire to form a magnetic circuit in cooperation with the magnetoresistive effect element when a current is caused to flow in the wire, the yoke having at least two soft magnetic layers stacked via a non-magnetic layer.

11. The magnetic memory according to claim 10, further comprising a barrier metal provided between the yoke and the wire.

12. The magnetic memory according to claim 10, wherein the non-magnetic layer of the yoke has a film thickness thinner than a shortest distance between an end portion of the yoke and an end portion of the magnetoresistive effect element.

13. The magnetic memory according to claim 11, wherein the barrier metal layer is formed of at least one element selected from the group of Ta, Ti, Si, Ge, Al, W, Mo and V or alloy thereof, or oxide or nitride thereof.

14. The magnetic memory according to claim 10, wherein the soft magnetic layer is one of a Ni—Fe alloy layer, a Co—Fe—Ni alloy layer, amorphous magnetic layer, and a micro-crystal ferromagnetic layer, and the amorphous magnetic layer or the mico-crystal ferromagnetic layer is formed of any one selected from the group of Co—Fe—AA, Co—Fe—AA—AA2, Fe—AA—AA2, Co—AA—AA2, Co—Mn—AA—AA2, Fe—Cu—AA—AA2, and Co—Fe—Ni—AA, where AA or AA2 comprises at least one selected from the group of B, Si, Ge, Zr, Nb, P, Mo, Ta, N, C, Ti, Al, W, V or rare earth elements.

15. The magnetic memory according to claim 10, wherein the non-magnetic layer comprises at least one element selected from the group of Al, Ga, In, Si, Ge, Ti, Zr, Hf, V, Nb, Ta, Cr, Mo, W, Cu, Zn, Ag, Au, Ru, Re, Os, or alloy thereof, oxide or nitride thereof.

16. The magnetic memory according to claim 10, wherein an interaction between the soft magnetic layers of the yoke is in a range between–2000 Oe and 500 Oe.

17. The magnetic memory according to claim 10, wherein the magnetoresistive effect element comprises a tunneling magnetoresistive effect element.

18. The magnetic memory according to claim 10, further comprising a selecting transistor for reading out recorded information stored in the storage layer of the magnetoresistive effect element.

19. A magnetic memory comprising:
at least one wire; a magnetoresistive effect element having a storage layer whose magnetization direction varies according to a current magnetic field generated by causing a current to flow in the wire; and a yoke which is provided on both side faces of the wire and on an opposite face of the wire to the magnetoresistive effect element to form a magnetic circuit in cooperation with the magnetoresistive effect element when a current is caused to flow in the wire, the yoke having at least two soft magnetic layers stacked via a non-magnetic layer.

20. The magnetic memory according to claim 19, further comprising a barrier metal provided between the yoke and the wire.

21. The magnetic memory according to claim 19, wherein the non-magnetic layer of the yoke has a film thickness thinner than a shortest distance between an end portion of the yoke and an end portion of the magnetoresistive effect element.

22. The magnetic memory according to claim 20, wherein the barrier metal layer is formed of at least one element selected from the group of Ta, Ti, Si, Ge, Al, W, Mo and V or alloy thereof, or oxide or nitride thereof.

23. The magnetic memory according to claim 19, wherein the soft magnetic layer is one of a Ni—Fe alloy layer, a Co—Fe—Ni alloy layer, amorphous magnetic layer, and a micro-crystal ferromagnetic layer, and the amorphous magnetic layer or the mico-crystal ferromagnetic layer is formed of any one selected from the group of Co—Fe—AA, Co—Fe—AA—AA2, Fe—AA—AA2, Co—AA—AA2, Co—Mn—AA—AA2 and FeCu—AA—AA2, and Co—Fe—Ni—AA, where AA or AA2 comprises at least one selected from the group of B, Si, Ge, Zr, Nb., P, Mo, Ta, N, C, Ti, Al, W, V or rare earth elements.

24. The magnetic memory according to claim 19, wherein the non-magnetic layer comprises at least one element selected from the group of Al, Ga, In, Si, Ge, Ti, Zr, Hf, V, Nb, Ta, Cr, Mo, W, Cu, Zn, Ag, Au, Ru, Re, Os, or alloy thereof, oxide or nitride thereof.

25. The magnetic memory according to claim 19, wherein an interaction between the soft magnetic layers of the yoke is in a range between–2000Oe and 500 Oe.

26. The magnetic memory according to claim 19, wherein the magnetoresistive effect element comprises a tunneling magnetoresistive effect element.

27. The magnetic memory according to claim 19, further comprising a selecting transistor for reading out recorded information stored in the storage layer of the magnetoresistive effect element.

* * * * *